United States Patent
Kamihara et al.

(10) Patent No.: US 6,732,205 B2
(45) Date of Patent: May 4, 2004

(54) SERIAL/PARALLEL CONVERSION CIRCUIT, DATA TRANSFER CONTROL DEVICE, AND ELECTRONIC EQUIPMENT

(75) Inventors: Yoshiyuki Kamihara, Sapporo (JP); Takuya Ishida, Sapporo (JP)

(73) Assignee: Seiko Epson Corporation, Tokyo (JP)

( * ) Notice: Subject to any disclaimer, the term of this patent is extended or adjusted under 35 U.S.C. 154(b) by 266 days.

(21) Appl. No.: 09/977,936

(22) Filed: Oct. 17, 2001

(65) Prior Publication Data

US 2002/0049872 A1 Apr. 25, 2002

(30) Foreign Application Priority Data

Oct. 25, 2000 (JP) ......................................... 2000-325341

(51) Int. Cl.[7] ........................... G06F 13/38; G06F 13/12
(52) U.S. Cl. ........................... 710/71; 710/65; 341/100; 375/340; 375/371; 375/372
(58) Field of Search ..................... 710/65, 71; 341/100; 375/340, 372, 371

(56) References Cited

U.S. PATENT DOCUMENTS

| | | | |
|---|---|---|---|
| 4,945,548 A | * 7/1990 | Iannarone et al. | 375/214 |
| 5,058,132 A | 10/1991 | Li | |
| 5,274,647 A | * 12/1993 | Tanaka | 714/799 |
| 5,323,426 A | * 6/1994 | James et al. | 375/372 |
| 5,550,874 A | 8/1996 | Lee | |
| 6,081,561 A | * 6/2000 | Julyan et al. | 375/340 |
| 6,330,245 B1 | * 12/2001 | Brewer et al. | 370/424 |
| 6,359,951 B1 | * 3/2002 | Morriss et al. | 375/377 |
| 6,509,851 B1 | * 1/2003 | Clark et al. | 341/100 |
| 6,594,329 B1 | * 7/2003 | Susnow | 375/372 |

FOREIGN PATENT DOCUMENTS

| | | |
|---|---|---|
| KR | 0170390 | 10/1998 |
| KR | 10-0177733 | 11/1998 |

OTHER PUBLICATIONS

USB2.0 Transceiver Macrocell Interface (UTMI) Specification, Version 1.0rc, Apr. 25, 2000, Intel Corporation.

* cited by examiner

Primary Examiner—Jeffrey Gaffin
Assistant Examiner—Tammara Peyton
(74) Attorney, Agent, or Firm—Oliff & Berridge, PLC

(57) ABSTRACT

The present invention provides a serial/parallel conversion circuit that has both a serial/parallel conversion function and a buffer function for absorbing clock frequency differences, together with a data transfer control device and electronic equipment. The serial/parallel conversion circuit (elasticity buffer) comprises a data holding register which holds serial data DIN that is input based on a CLK1 clock (480 MHz) in USB 2.0 HS mode; a determination circuit which determines whether or not held data is valid, by unit of a data cell; and a selector which outputs from the data holding register the data of data cells that have been determined to be valid, based on a CLK2 clock (60 MHz) having a frequency lower than that of CLK1. A data cell in which data of the first bit has been determined to be valid is deemed to be valid in the next CLK2 clock cycle. The determination of whether or not data cells are valid is done in each clock cycle of CLK2, and the output of data in a data cell that is determined not to be valid is made to wait for one clock cycle. A write pulse signal is generated and the data holding register and data status register are operated thereby.

20 Claims, 17 Drawing Sheets

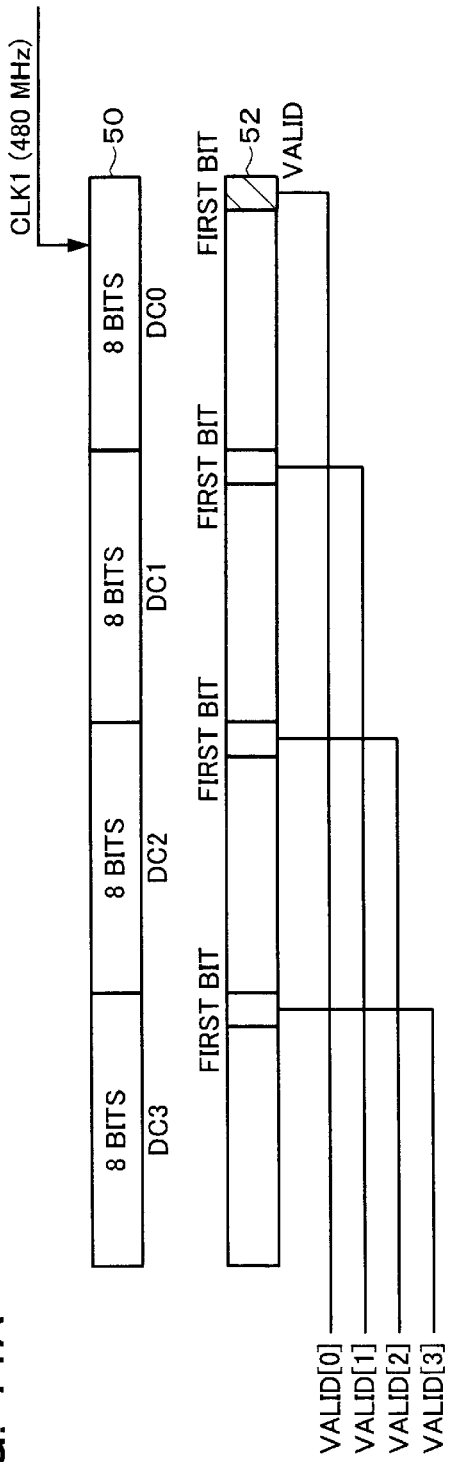
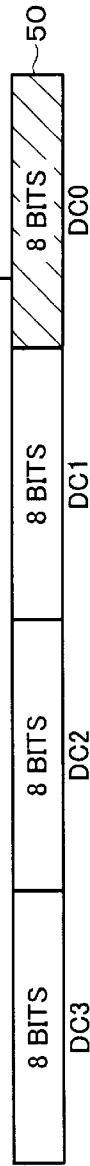
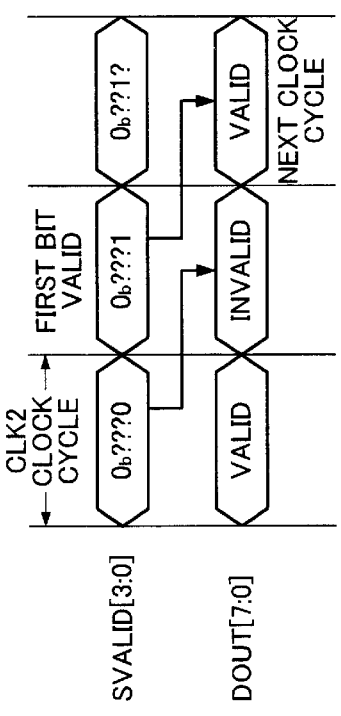
FIG. 11A
FIG. 11B
FIG. 11C

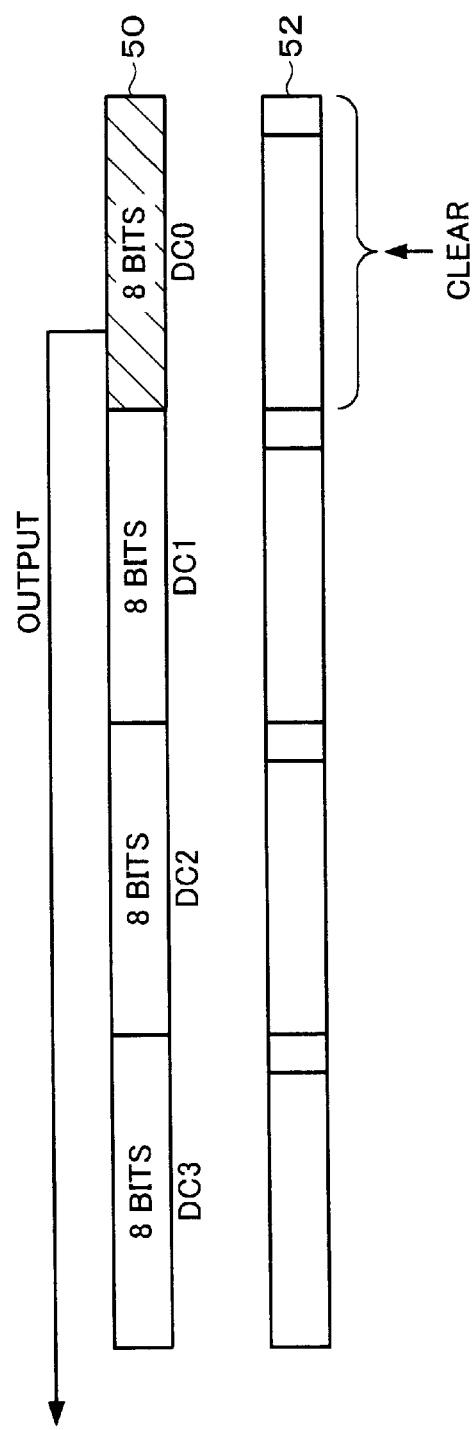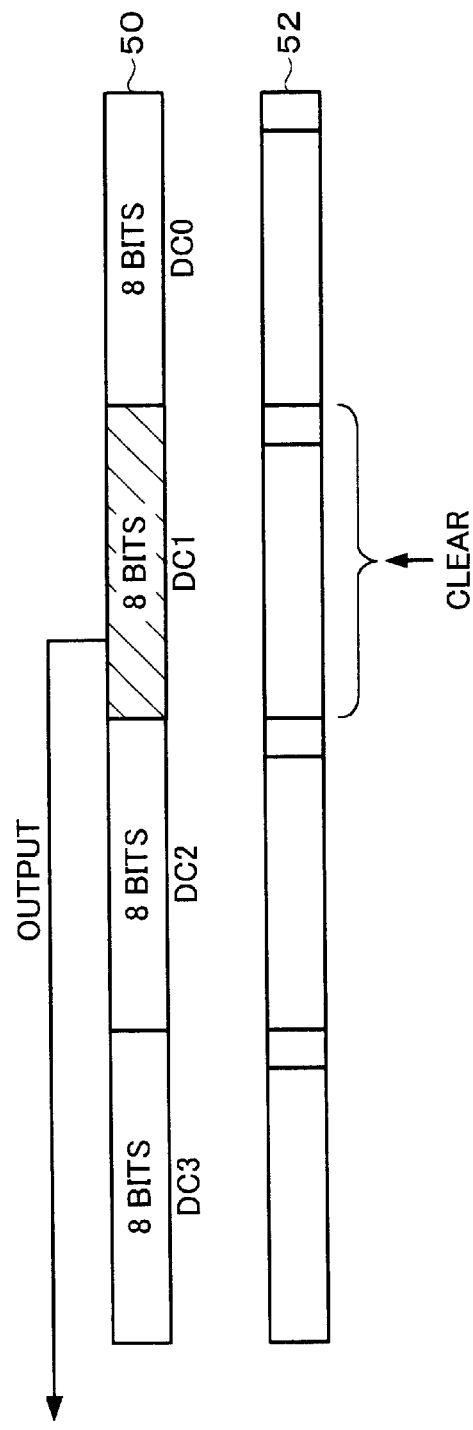
FIG. 12A
FIG. 12B

SERIAL/PARALLEL CONVERSION CIRCUIT, DATA TRANSFER CONTROL DEVICE, AND ELECTRONIC EQUIPMENT

Japanese patent application no. 2000-325341 filed Oct. 25, 2000 is hereby incorporated by reference in its entirety.

TECHNICAL FIELD

The present invention relates to a serial/parallel conversion circuit, a data transfer control device, and electronic equipment.

BACKGROUND

The universal serial bus (USB) standard has recently attracted attention as an interface standard for connections between personal computers and peripheral equipment (generally speaking: electronic equipment). This USB standard has the advantage of enabling the use of connectors of the same standard to connect peripheral equipment such as a mouse, keyboard, and printer, which are connected by connectors of different standards in the prior art, and of making it possible to implement plug-and-play and hot-plug features.

In comparison with the IEEE 1394 standard which is also attracting notice as a standard for the same serial bus interface, this USB standard has a problem in that the transfer speed thereof is slower.

In this case, attention is being paid to the decision to use the USB 2.0 standard which can implement a data transfer speed of 480 Mbps (in HS mode), far faster than those of the previous USB 1.1 standard, while maintaining backward compatibility with USB 1.1. The USB 2.0 transceiver macrocell interface (UTMI), which defined interface specifications for the physical-layer and logical-layer circuitry under USB 2.0, has also been determined.

SUMMARY

An aspect of the present invention relates to a serial/parallel conversion circuit which converts serial data into parallel data, the serial/parallel conversion circuit comprising:

a data holding circuit which receives and holds serial data that is input based on a first clock;

a determination circuit which determines whether or not data held in the data holding circuit is valid, by unit of a data cell configured of a plurality of bits; and a circuit which outputs data of a data cell that has been determined to be valid, based on a second clock having a frequency lower than a frequency of the first clock.

Another aspect of the present invention relates to a serial/parallel conversion circuit which converts serial data into parallel data, the serial/parallel conversion circuit comprising:

a data holding circuit which receives and holds serial data that is input based on a first clock;

a circuit which outputs data from the data holding circuit based on a second clock having a frequency lower than a frequency of the first clock;

a data status holding circuit which holds a status of data held in the data holding circuit; and a write pulse generation circuit which generates first to N-th write pulse signals having pulses that go active periodically once every N clock cycles of the first clock, and a period at which a pulse of each of the first to N-th write pulse signals going active is shifted from one another by one clock cycle of the first clock, wherein the data holding circuit holds data, based on the first to N-th write pulse signals, and wherein the data status holding circuit holds the data status, based on the first to N-th write pulse signals.

BRIEF DESCRIPTION OF THE DRAWINGS

FIGS. 11A, 11B, and 11C are illustrative of a method of determining whether or not the first bit of data in a data cell is valid, and determining whether that data cell is valid or invalid;

FIGS. 12A and 12B is illustrative of a method of clearing data status in data cell units;

DETAILED DESCRIPTION

Figure 1:
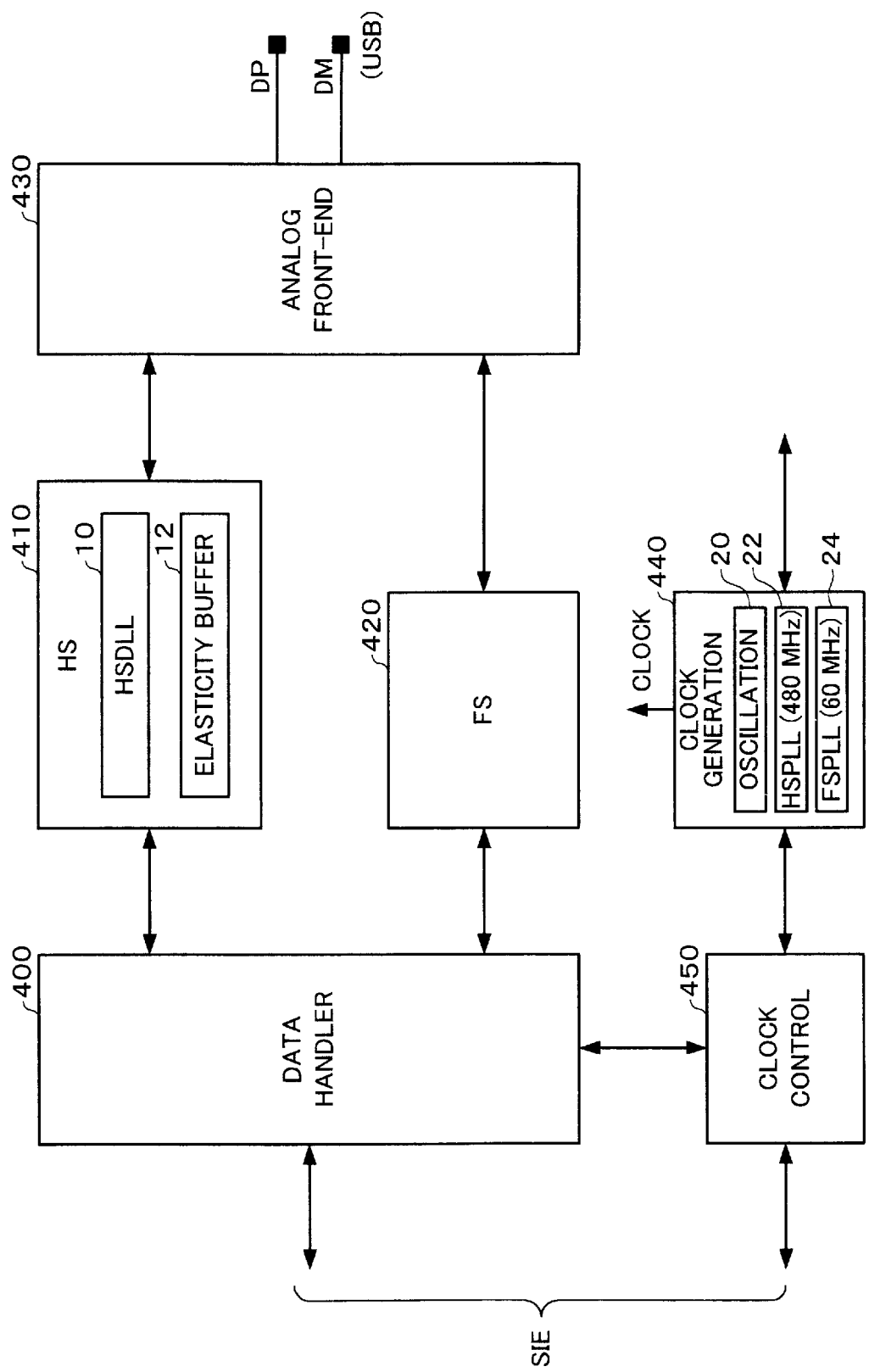
FIG. 1 shows an example of the configuration of a data transfer control device in accordance with an embodiment.

Embodiments of the present invention are described below.

Note that the embodiments described below do not in any way limit the gist of the present invention laid out in the claims herein. In addition, all of the configurations described for these embodiments do not limit the components that are essential as requirements of the present invention.

Since data transfer in high-speed (HS) mode under USB 2.0 is at 480 Mbps, it has the advantage that it can be used as an interface for high-speed drives where rapid transfer speeds are required.

However, a data transfer control device (physical layer circuitry and logical layer circuitry) connected to USB must generate a high-frequency sampling clock at 480 MHz, in order to sample the data that is transferred thereinto at 480

Mbps, necessitating fast circuit components capable of operating at that 480-MHz clock frequency. It would be possible to implement circuit operation at 480 MHz by using the latest semiconductor processes which enable microprocessing, but it would be extremely difficult to implement fast circuit operation if up-to-date semiconductor processing cannot be used.

One method of implementing 480-MHz high-speed circuit operation without employing the latest semiconductor processes is a method whereby the circuitry is laid out and wired manually, which minimizes clock skew and ensures synchronization.

However, this circuit layout and wiring by manual means leads to an increase in the design period and a higher cost of the resultant device, in comparison with an efficient circuit design method that utilizes circuit layout and automatic wiring by hardware description language (HDL), and it also hinders the creation of macrocells of the data transfer control device (physical-layer circuitry and logical-layer circuitry).

This embodiment was devised in the light of the above described technical problems, making it possible to provide a serial/parallel conversion circuit that is optimized for the serial-to-parallel conversion of data that is transferred over a high-speed bus, together with a data transfer control device and electronic equipment that uses the same.

This embodiment also makes it possible to provide a serial/parallel conversion circuit that has both a serial/parallel conversion function and also a buffer function for absorbing differences in clock frequency, together with a data transfer control device and electronic equipment that uses the same.

This embodiment relates to a serial/parallel conversion circuit which converts serial data into parallel data, the serial/parallel conversion circuit comprising:

a data holding circuit which receives and holds serial data that is input based on a first clock;

a determination circuit which determines whether or not data held in the data holding circuit is valid, by unit of a data cell configured of a plurality of bits; and a circuit which outputs data of a data cell that has been determined to be valid, based on a second clock having a frequency lower than a frequency of the first clock.

With this embodiment, serial data is input based on a first clock of a fast frequency, and a data holding circuit holds it. The system then determines whether or not the data is valid by unit of a data cell, and each data cell that is valid is output based on a second clock of a frequency that is lower than that of the first clock.

Since this embodiment is configured in such a manner that input serial data is output as parallel data in data cell units, it makes it possible to implement a serial/parallel data conversion function. Since the thus-input serial data is held by the data holding circuit and only data cells that have been determined to be valid are output from the data holding circuit, it is possible to implement a buffer function that absorbs (compensates for) differences in clock frequency or phase.

This embodiment makes it possible to implement a serial/parallel conversion circuit of a type that has been unknown up until now, with both a serial/parallel conversion function and a buffer function for absorbing differences such as those in clock frequency. Moreover, since it also makes it possible for the determination circuit to operate based on a second clock of a lower frequency, it makes it possible to give a certain amount of leeway in the timing of the various types of processing for implementing these serial/parallel conversion and buffer functions, enabling the provision of a serial/parallel conversion circuit that is optimized for a data transfer control device.

With this embodiment, the determination circuit may determine that a data cell in which a given bit of data has been determined to be valid in a K-th clock cycle of the second clock is a valid data cell in (K+1)-th or subsequent clock cycles of the second clock.

This makes it possible to determine whether a data cell is valid or invalid by determining whether just one bit (such as the first bit) in the data cell is valid or invalid, thus enabling a simplification of the configuration and processing of the determination circuit.

With this embodiment, the determination circuit may determine whether or not a data cell is valid for each clock cycle of the second clock, and may cause an output of a data cell to wait for at least one clock cycle when the data cell is determined to be invalid.

This wait control ensures that only suitable data is output to the next stage. In addition, it is possible to prevent processing failure if an underflow state should occur in the data holding circuit. Since it is also possible to impose wait control by using the clock cycle period of a lower-frequency second clock, it becomes possible to implement more intelligent wait control.

This embodiment may further comprise a data status holding circuit which holds a status of data held in the data holding circuit, and the determination circuit may determine whether or not each data cell is valid, based on a data status from the data status holding circuit.

If this data status holding circuit is provided separately from the data holding circuit in this manner, the configuration of the data holding circuit can be simplified and it becomes possible to improve the reliability of the serial data fetch processing.

This embodiment may further comprise a data status holding circuit which holds a status of data held in the data holding circuit, and the determination circuit may determine whether or not to wait to output data of a data cell, based on a data status from the data status holding circuit.

This configuration makes it possible to implement wait control by simply monitoring data statuses of the data status holding circuit. The implementation of wait control makes it possible to output only suitable data to the next stage and prevent processing failures even when underflow occurs.

This embodiment may further comprise a data status holding circuit which holds a status of data held in the data holding circuit, and the determination circuit may clear the data status held in the data status holding circuit by unit of a data cell.

This configuration makes it possible to clear the data status of each data cell that has finished being output, thus enabling reuse of that data status as the data status of another data cell. It therefore becomes possible to hold suitable data statuses in the data status holding circuit, even when the data holding circuit has a ring buffer configuration, by way of example.

This embodiment may further comprise:

a data status holding circuit which holds a status of data held in the data holding circuit; and a write pulse generation circuit which generates first to N-th write pulse signals having pulses that go active periodically once every N clock cycles of the first clock, and a period at which a pulse of each of the first to N-th write pulse signals going active is shifted from one another by one clock cycle of the first clock, and the data holding circuit may hold data, based on the first to N-th write pulse signals, and the data status holding circuit may hold the data status, based on the first to N-th write pulse signals.

This embodiment also relates to a serial/parallel conversion circuit which converts serial data into parallel data, the serial/parallel conversion circuit comprising:

a data holding circuit which receives and holds serial data that is input based on a first clock;

a circuit which outputs data from the data holding circuit based on a second clock having a frequency lower than a frequency of the first clock;

a data status holding circuit which holds a status of data held in the data holding circuit; and a write pulse generation circuit which generates first to N-th write pulse signals having pulses that go active periodically once every N clock cycles of the first clock, and a period at which a pulse of each of the first to N-th write pulse signals going active is shifted from one another by one clock cycle of the first clock, wherein the data holding circuit holds data, based on the first to N-th write pulse signals, and wherein the data status holding circuit holds the data status, based on the first to N-th write pulse signals.

In this embodiment, a write pulse signal having pulses that go periodically active every N-th clock cycle of a first clock (where N is the number of bits of the data holding circuit or the data status holding circuit, by way of example) is generated. The data holding circuit and the data status holding circuit operate in accordance with this write pulse signal. It is therefore possible to provide a certain amount of leeway in the timing of holding circuits (circuits for holding each bit of data) comprised within the data holding circuit and holding circuits (circuits for holding the status of each bit of data) comprised within the data status holding circuit, thus enabling an increase in the reliability of those holding circuits. The N clock cycle period can be used to implement various types of processing such as overflow control. Note that the data status holding circuit need not necessarily hold the statuses of all the bits of data; it could equally well hold the data statuses in at least unit of a data cell. If the statuses of only some of the bits of data are held, only some of the first to N-th write pulse signals are need to be used.

This embodiment may also relate to a data transfer control device which transfers data over a bus; the data transfer control device comprising: any of the above described serial/parallel conversion circuits; and a circuit which receives data from the serial/parallel conversion circuit and performs given processing for data transfer.

This embodiment makes it possible to implement serial/parallel conversion processing for the data transferred over a bus, using a serial/parallel conversion circuit that has both a serial/parallel conversion function and a buffer function for absorbing differences such as those in clock frequency. Even if there are differences in frequency or phase of the clock within the data transfer control device and the clock of the external device connected to the bus, those differences can be absorbed, making it possible to implement data transfer processing of an even higher reliability.

With this embodiment, when data transfer is performed in accordance with a given standard, the second clock may be generated based on a third clock having a frequency higher than a frequency of the first clock defined by the given standard.

This makes it possible to implement a data transfer control device that can cope flexibly even when the external device connected to the bus does not observe a clock frequency standard.

With this embodiment, data transfer may be in accordance with a universal serial bus (USB) standard.

This makes it possible to enable a suitable implementation of applications such as data transfer in the HS mode laid down by USB 2.0, by way of example.

Electronic equipment in accordance with this embodiment may comprise any of the above described data transfer control devices, and a device which performs output processing, fetch processing or storage processing on data transferred through the data transfer control device and the bus.

This makes it possible to reduce the cost and increase the reliability of a data transfer control device used in electronic equipment, thus reducing the cost and increasing the reliability of the electronic equipment itself. This embodiment also makes it possible to perform data transfer in a fast transfer mode, thus increasing the speed of processing of electronic equipment.

The above embodiments are described below in detail with reference to the accompanying figures.

1. Configuration and Operation 1.1 Data Transfer Control Device

An example of the configuration of a data transfer control device in accordance with the present invention is shown in FIG. 1.

The data transfer control device of this embodiment comprises a data handler circuit 400, a high-speed (HS) circuit 410, a full-speed (FS) circuit 420, an analog front-end circuit 430, a clock generation circuit 440, and a clock control circuit 450. Note that not all of the circuit blocks shown in FIG. 1 are necessary for the data transfer control device of the present invention; some of them may be omitted.

The data handler circuit 400 (generally speaking: a given circuit for performing data transfer) performs various types of processing which transfers data in conformation with a standard such as USB. More specifically, during transmission, it performs processing such as attaching synchronization (SYNC), start of packet (SOP), and end of packet (EOP) codes to the data to be transmitted, and bit stuffing. During reception, on the other hand, it performs processing to detect and remove the SYNC, SOP, and EOP codes, and bit unstuffing. In addition is generates various timing signals for controlling the data transfer.

Note that received data is output to a serial interface engine (SIE) that is a stage after the data handler circuit 400, and data to be transmitted is input to the data handler circuit 400 from the SIE.

The HS circuit 410 is a logic circuit which transfers data at high speed (HS), which is a data transfer speed of 480 Mbps, and the FS circuit 420 is a logic circuit which transfers data at a full speed (FS), which is a data transfer speed of 12 Mbps.

In this case, HS mode is a new transfer mode that has been defined by USB 2.0. FS mode, on the other hand, is a transfer mode that was defined previously by the USB 1.1.

Since USB 2.0 provides this HS mode, it makes it possible to implement not only data transfer for devices such as printers, audio equipment, and cameras, but also data transfer in storage devices such as hard disk drives or optical disk (CD-ROM or DVD) drives.

The HS circuit 410 comprises a high-speed delay line PLL (HSDLL) circuit 10 and an elasticity buffer 12.

In this case, the HSDLL circuit 10 is a circuit that generates a data fetch clock based on received data and a clock from the clock generation circuit 440 (PLL).

The elasticity buffer 12 is a circuit for absorbing any difference in clock frequency (clock drift) between the internal device (the data transfer control device) and an external device (an external device connected to the bus).

The analog front-end circuit 430 is an analog circuit comprising drivers and receivers for transfer at FS and HS. With USB, data is transferred by a differential signal, using data-plus (DP) and data-minus (DM) signals.

The clock generation circuit 440 generates a 480-MHz clock used within the device and a 60-MHz clock used within the device and by the SIE.

The clock generation circuit 440 comprises an oscillation circuit 20, an HS phase-locked loop (HSPLL) 22, and an FS phase-locked loop (FSPLL) 24.

In this case, the oscillation circuit 20 generates a base clock in combination with a component such as an external oscillator, by way of example.

The HSPLL 22 is a PLL that generates the 480-MHz clock necessary for HS mode as well as the 60-MHz clock necessary for FS mode, various components within the device, and the SIE, based on the base clock generated by the oscillation circuit 20. Note that when transfer is in HS mode, it is necessary to validate clock generation by the HSPLL 22.

The FSPLL 24 generates the 60-MHz clock necessary for FS mode, various components within the device, and the SIE, based on the base clock generated by the oscillation circuit 20. Note that transfer in HS mode is not possible when clock generation by this FSPLL 24 is enabled.

The clock control circuit 450 receives various control signals from the SIE and performs processing such as control of the clock generation circuit 440. Note that the 60-MHz system clock generated by the clock generation circuit 440 is output to the SIE through the clock control circuit 450.

1.2 Serial/Parallel Conversion Circuit

With UTMI, which defines interface specifications for physical-layer and logical-layer circuitry in USB 2.0, recommends the provision of an "elasticity buffer", which is a buffer for absorbing any differences such as those of clock frequency between an internal device (a data transfer control device) and an external device (an external device connected to the bus).

Figure 2:
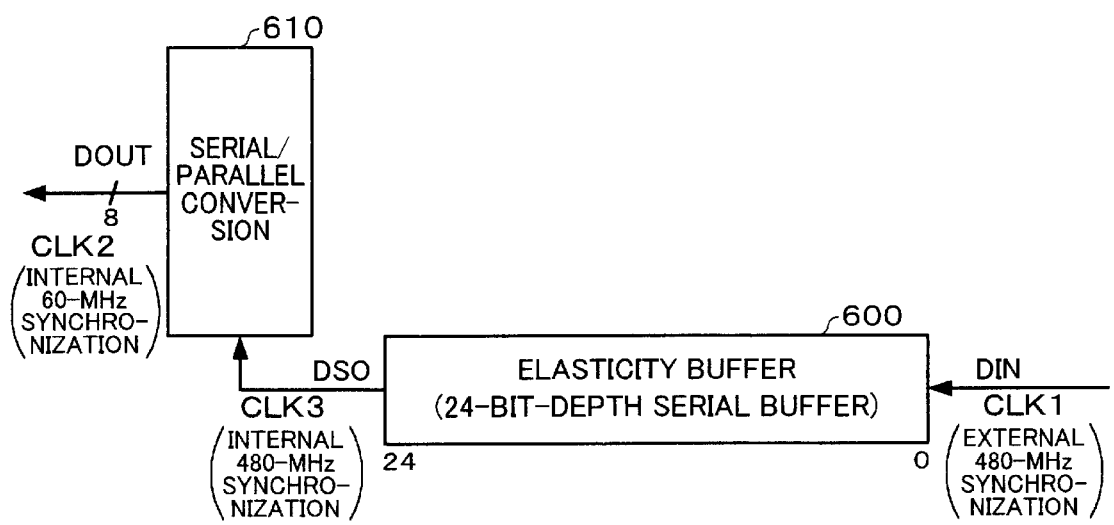
FIG. 2 is illustrative of a comparative example.

A comparative example of the implementation of an elasticity buffer is shown in FIG. 2.

An elasticity buffer 600 shown in FIG. 2 is a 24-bit deep serial buffer (FIFO) for the sequential fetching of serial data DIN, using CLK1 (an external 480-MHz synchronization clock that is a fetch clock output from the HSDLL). The fetched DIN is output as serial data DSO in synchronization with CLK3 (an internal 480-MHz synchronization clock), in the sequence in which it has been input. A serial/parallel conversion circuit 610 converts this serial data DSO into 8-bit parallel data and outputs it as DOUT in synchronization with CLK2 (an internal 60-MHz synchronization clock).

Figure 3A:
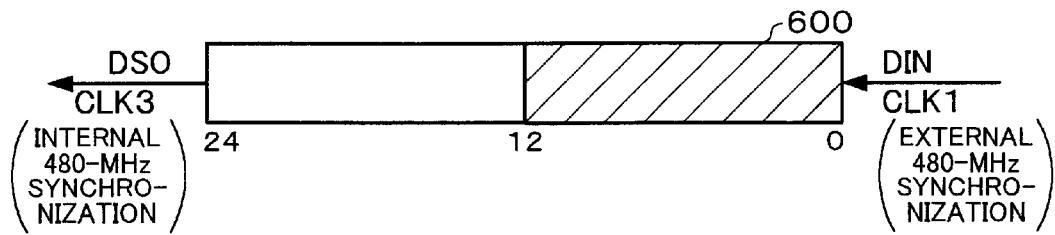
FIGS. 3A, 3B, and 3C are further illustrative of the comparative example.

The output of the data DSO in synchronization with CLK3 starts at the point at which the elasticity buffer 600 has accumulated data to a 12-bit depth, as shown in FIG. 3A.

Figure 3B:
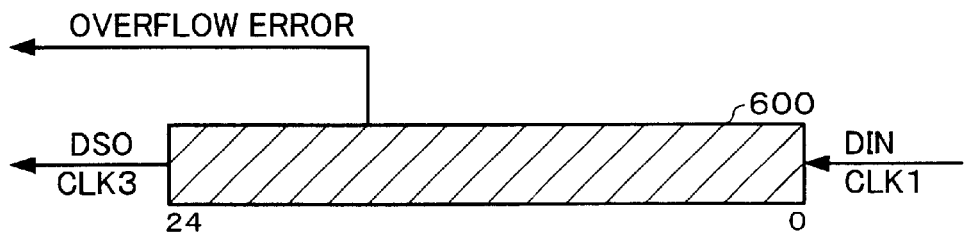

An overflow error is output if the data within the elasticity buffer 600 exceeds 24 bits, as shown in FIG. 3B.

Figure 3C:
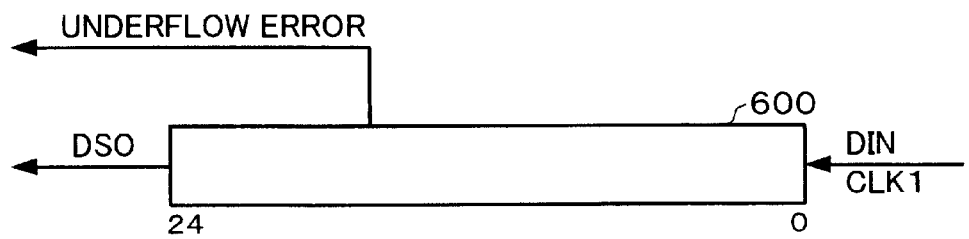

An underflow error is output if the data within the elasticity buffer 600 is empty, as shown in FIG. 3C.

Under USB 2.0 (UTMI), by way of example, a clock error in HS mode is defined at 480 MHz±500 ppm. If both the external device and the internal device observe the 480 MHz±500 ppm standard, up to ±12 bits of drift can occur during the transfer of one packet of data. It is possible to prevent overflow and underflow errors by setting the depth of the elasticity buffer 600 to at least 24 bits and also setting the threshold value for data output start to the midpoint (bit 12), as shown in FIG. 3A.

The elasticity buffer 600 of the comparative example shown in FIG. 2 uses the 480-MHz CLK3 to output the serially-input data as serial data. It is therefore necessary to ensure that all the components of the elasticity buffer 600 can operate at this 480-MHz clock. In other words, processing such as that for setting the input point (the input address) and the output point (the output address) of the FIFO data, for setting the mid-point of the data output start threshold value (at bit 12) as shown in FIG. 3A, or for detecting overflow or underflow errors (full and empty signal generation) as shown in FIGS. 3B and 3C must be implemented by circuitry operating at 480 MHz.

It would be possible in such a case to implement fast circuitry that operates at this 480 MHz by using the latest semiconductor processes which enable microprocessing.

However, when it comes to incorporating a data transfer control device (UTMI transceiver) in a macrocell or an application specific integrated circuit (ASIC), it is desirable to use ordinary semiconductor processing instead of the latest semiconductor processing.

If the circuit pattern of the elasticity buffer is laid out manually to optimize wiring capacitances, it is possible to implement high-speed operation at 480 MHz even if ordinary semiconductor processing is used.

However, this manual layout work leads to problems such as inefficient design, longer development periods, and higher device costs.

The present invention resolves the above described technical problem by providing a serial/parallel conversion circuit that has both a serial/parallel conversion function and also a buffer function that absorbs (compensates for) clock frequency differences.

Figure 4:
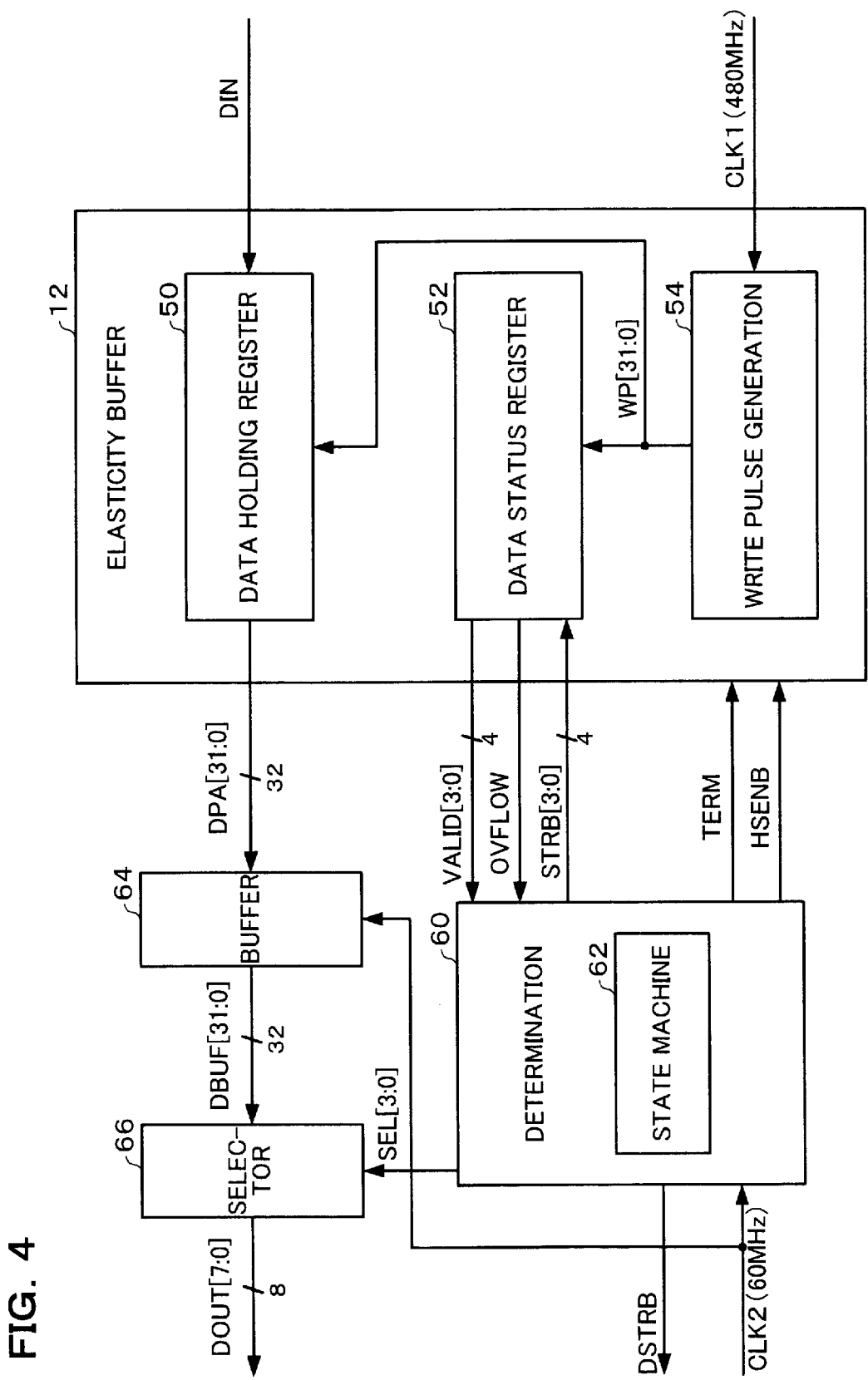
FIG. 4 shows an example of the configuration of the serial/parallel conversion circuit in accordance with this embodiment.

An example of the configuration of the serial/parallel conversion circuit (elasticity buffer) in accordance with this embodiment is shown in FIG. 4.

The serial/parallel conversion circuit of FIG. 4 comprises the elasticity buffer 12, a determination circuit 60, a buffer 64, and a selector 66. Note that the elasticity buffer 12 is comprised within the HS circuit 410 of FIG. 1 and the determination circuit 60, the buffer 64, and the selector 66 could be comprised within the data handler circuit 400 of FIG. 1, by way of example.

The elasticity buffer 12 comprises a data holding register 50 (data holding means), a data status register 52 (data status holding means), and a write pulse generation circuit 54 (write pulse generation means).

In this case, the data holding register 50 is a 32-bit wide register that receives and holds the serial data DIN, which is input using the 480-MHz CLK1 (first clock). Note that these CLK1 and DIN signals are input from the HSDLL circuit 10 of FIG. 1.

The data status register 52 is a 32-bit wide register that holds the status of each bit of data in the data holding register 50.

The write pulse generation circuit 54 generates a 32-bit wide write pulse signal WP [31:0] and outputs it to the data holding register 50 and the data status register 52.

In this case, the write pulse signal WP [31:0] is a signal in which each pulse goes active periodically once every 32 clock cycles (generally speaking: once every N clock cycles) of CLK 1 and the periods at which each pulse goes active are each shifted by one clock cycle. The data holding register 50 holds each bit of data, based on this write pulse signal WP [31:0]. Similarly, the data status register 52 holds each bit of the status, based on this write pulse signal WP [31:0].

The determination circuit 60 (determination means) operates in accordance with an internal state machine 62 to determine whether or not the data held in the data holding register 50 is valid, by unit of a data cell configured of a plurality of bits (such as 8 bits).

More specifically, the determination circuit 60 receives from the data status register 52 a 4-bit wide signal VALID [3:0] that indicates whether or not each data cell of the data holding register 50 is valid and a signal OVFLOW that becomes active when the data holding register 50 overflows.

It also determines whether or not each data cell is valid and outputs to the selector 66 a signal SEL [3:0] for selecting valid data cells. If, SEL [3] is "1", for example, DBUF [31:24] is selected for output as DOUT [7:0]. Similarly, if each of SEL [2], SEL [1], and SEL [0] is "1", DBUF [23:16], DBUF [15:8], and DBUF [7:0] are selected for output as DOUT [7:0].

The determination circuit 60 also outputs to the later-stage circuit a strobe signal DSTRB that indicates whether or not the data DOUT [7:0] output from the selector 66 is valid. This DSTRB is a signal that changes in synchronization with the clock CLK2 and goes active when DOUT [7:0] is valid.

In addition, the determination circuit 60 outputs to the data status register 52 a 4-bit wide signal STRB [3:0] for clearing the data statuses held in the data status register 52, by unit of a data cell, and it outputs to the elasticity buffer 12 a signal TERM that goes active at the completion of packet reception in HS mode and a signal HSENB that enables reception in HS mode.

Note that if a decoding circuit is provided for the selector 66, the determination circuit 60, and the data status register 52, the SEL, VALID, and STRB can have a 2-bit width instead of a 4-bit width.

The buffer 64 receives 32-bit wide parallel data DPA [31:0] from the data holding register 50 and outputs data DBUF [31:0], which has been buffered in synchronization with the 60-MHz clock CLK2, to the selector 66.

The selector 66 (output means) selects data in valid data cells from the data DBUF [31:0] from the buffer 64, based on the signal SEL [3:0] from the determination circuit 60, and outputs it as 8-bit wide data DOUT [7:0].

Figure 5:
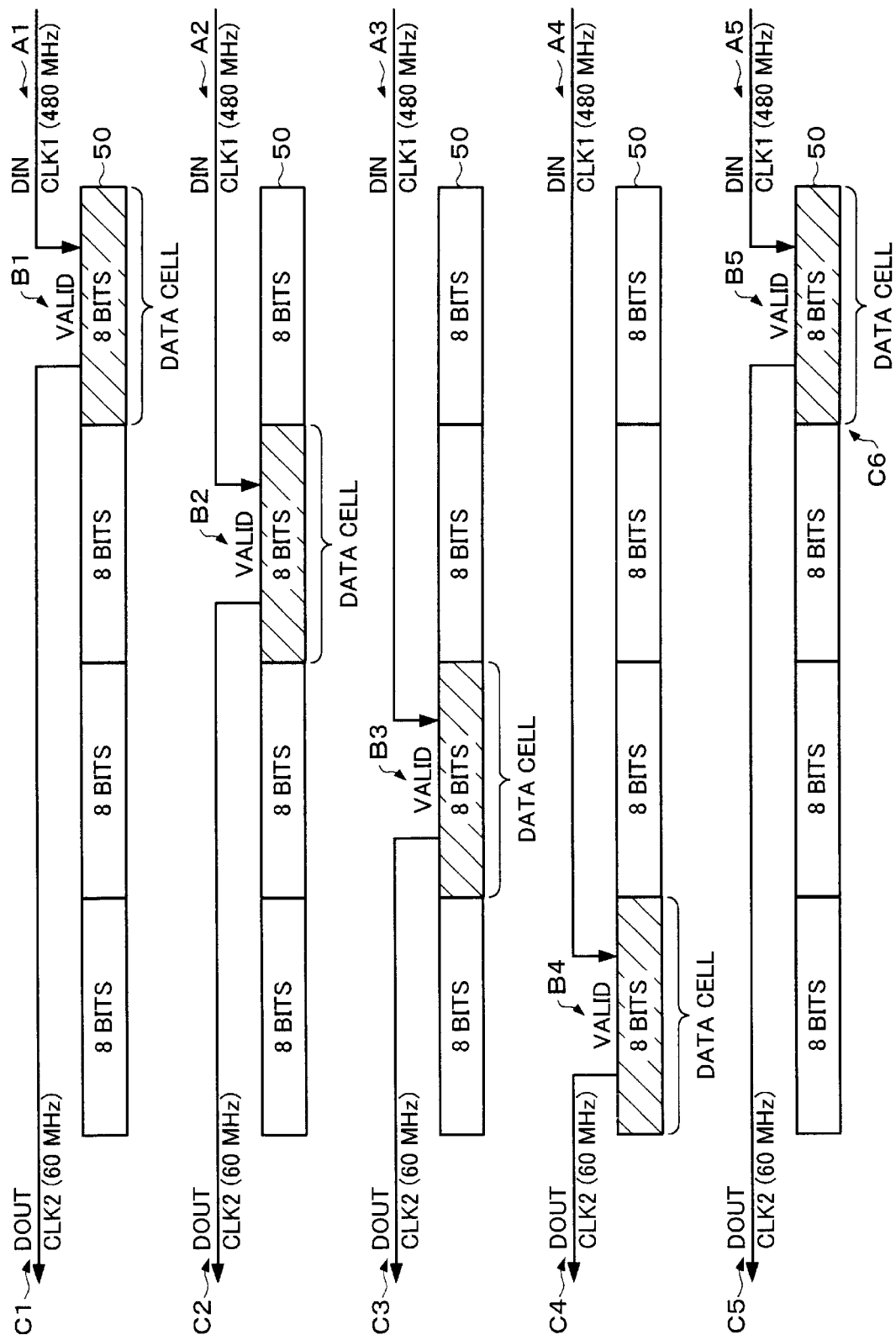
FIG. 5 is a conceptual diagram of the operation of the serial/parallel conversion circuit in accordance with this embodiment.

A conceptual diagram of the operation of the serial/parallel conversion circuit of this embodiment is shown in FIG. 5.

In this embodiment, the serial data DIN that is input based on the 480-MHz CLK1 (first clock) is sequentially held in the data holding register 50, as shown at A1 to A5 in FIG. 5 by way of example.

The determination of whether or not the data held in the data holding register 50 is valid (whether or not there is a string of data that can be output) is done by unit of a data cell, each configured of eight bits (generally speaking: a plurality of bits), as shown at B1 to B5 in FIG. 5. This is implemented by basing the determination of the determination circuit 60 on the VALID [3:0] signal from the data status register 52.

The contents of a data cell that has been determined to be valid is output from the serial/parallel conversion circuit of this embodiment based on the 60-MHz CLK2 (the second clock), which has a frequency lower than that of CLK1, as shown at C1 to C5 in FIG. 5. This is implemented by selecting the data of the valid data cell from DBUF [31:0], based on the signal SEL [3:0] from the determination circuit 60.

Note that the data holding register 50 (elasticity buffer) of this embodiment has a ring-buffer configuration, as indicated at C6 in FIG. 5.

In accordance with this embodiment, data is determined to be valid or invalid in units of data cells (units of a plurality of bits), and data is output from the serial/parallel conversion circuit in data cell units. It is therefore possible to implement processing such as a determination of whether data is valid or invalid, or whether there is an overflow error, based on the low-frequency 60-MHz CLK2, by way of example. In contrast with the comparative example of FIG. 2, in which such determination processing has to be done at the timing of the 480-MHz CLK3, this embodiment makes it possible to implement the function of an elasticity buffer as defined by UTMI, without employing the latest semiconductor processes which enable microprocessing.

Since it is not necessary to do the layout manually and the circuit patterning can be generated by automatic wiring processing, the development period can be shortened and the device costs reduced.

Since the determination circuit 60 and other components can operate at the lower clock frequency of 60 MHz, resistance against clock skew and jitter can be increased, and thus the reliability of data transfer can be greatly improved.

With the comparative example shown in FIG. 2, two-step synchronization timing adjustment is necessary between CLK1 and CLK3 and between CLK3 and CLK2, but this embodiment needs only one-stage timing adjustment between CLK1 and CLK2. It is therefore possible to facilitate timing design and also increase the reliability of circuit operation.

With the comparative example shown in FIG. 2, it is necessary to start data output processing as soon as 12 bits of data have accumulated, but there is a time lag before processing starts so this embodiment of FIG. 4 also makes it possible to eliminate that time lag.

1.3 Detailed Circuit Configuration

Figure 6:
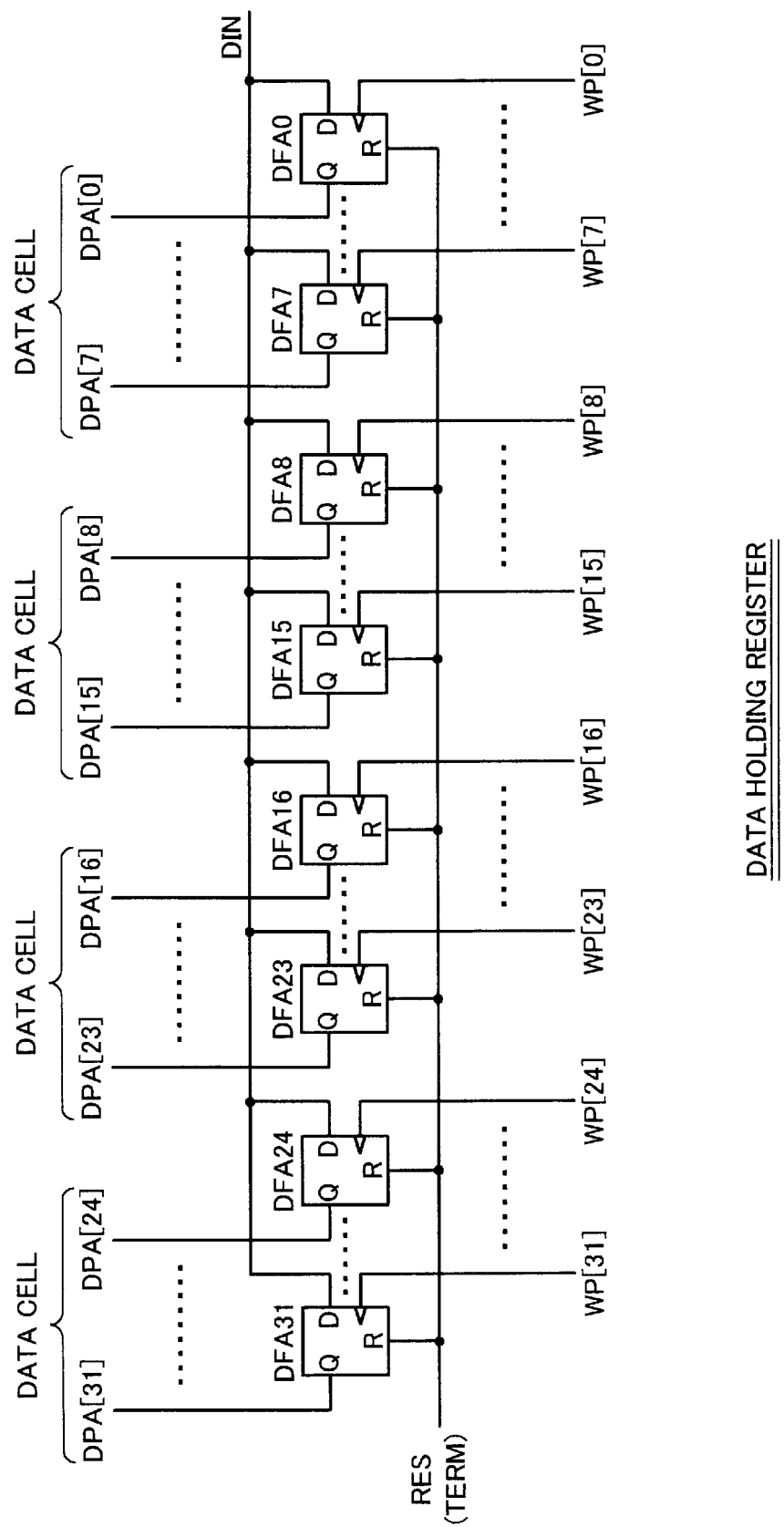
FIG. 6 shows a detailed example of the configuration of the data holding register.

A detailed example of the configuration of the data holding register 50 of FIG. 4 is shown in FIG. 6. Note that FIG. 6 shows only essential components of the data holding register 50, in order to simplify the description.

As shown in FIG. 6, the data holding register 50 comprises D flip-flops (generally speaking: holding means) DFA31 to DFA0.

The serial data DIN is input to data input terminals of DFA31 to DFA0.

Similarly, the write pulse signal WP [31:0] from the write pulse generation circuit 54 is input to clock terminals of DFA31 to DFA0.

The TERM signal from the determination circuit 60 is input to reset terminals of DFA31 to DFA0.

Output signals from DFA31 to DFA0 are output to the buffer 64 as a DPA [31:0] signal.

With the configuration shown in FIG. 6, each bit of the serial data DIN is held sequentially in DFA31 to DFA0 by the write pulse signal WP [31:0]. In other words, if a given bit is held in DFA0, the next bit is held in DFA1, and the next bit after that is held in DFA2. In this manner, the bits of DIN are held sequentially so that when a given bit of DIN is held in DFA31, the next bit is held in DFA0, thus implementing a ring buffer.

When a reset signal RES goes active, all of DFA31 to DFA0 is reset and all bits of DPA [31:0] go to "0" (logic level).

Note that the generation of the RES signal is based on the TERM signal of FIG. 4.

Data cells are configured of DFA7 to DFA0 (output DPA [7:0]), DFA15 to DFA8 (DPA [15:8]), DFA23 to DFA16 (DPA [23:16]), and DFA31 to DFA24 (DPA [31:24]), as shown in FIG. 6.

Figure 7:
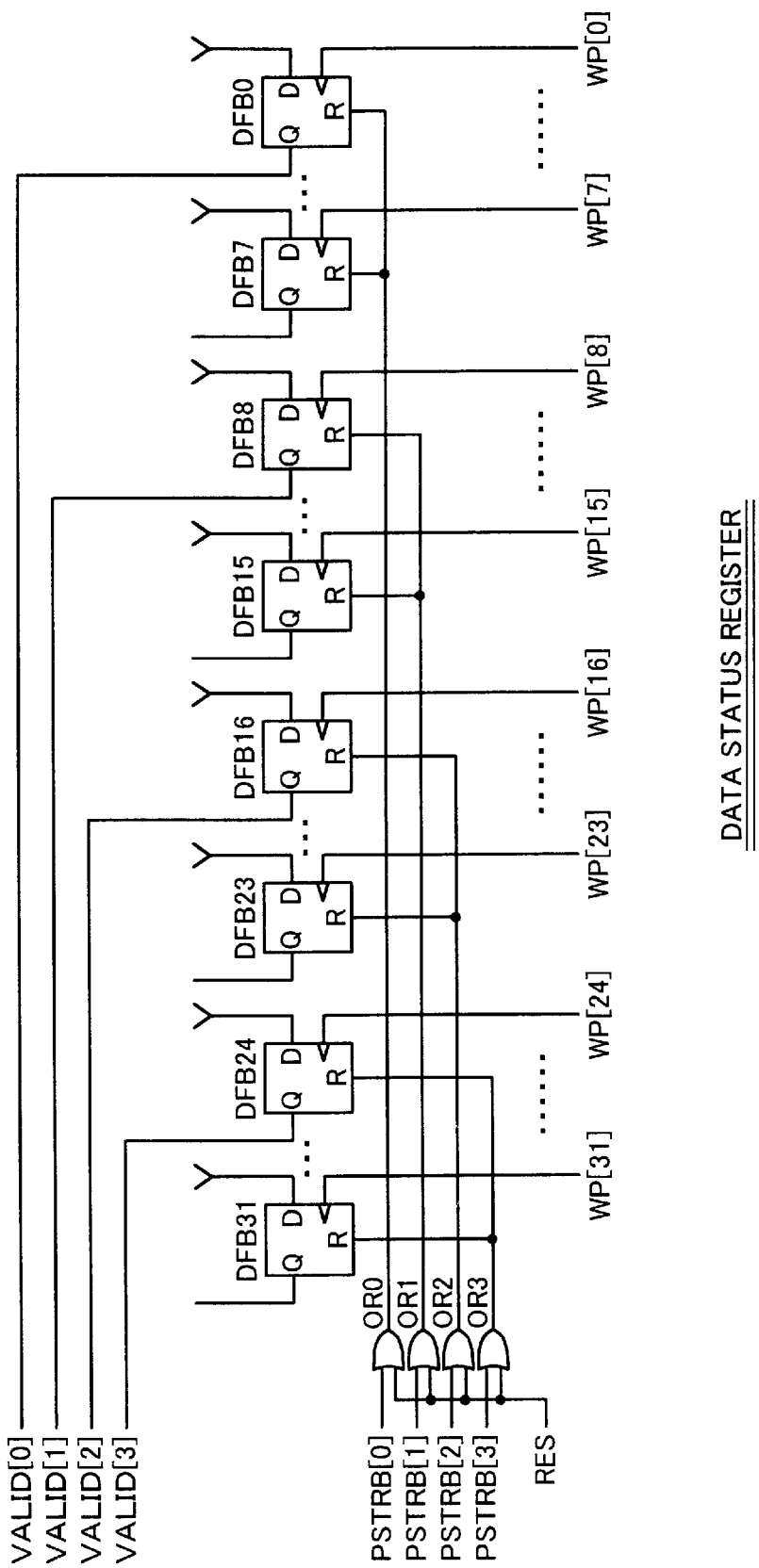
FIG. 7 shows a detailed example of the configuration of the data status register.

A detailed example of the configuration of the data status register 52 of FIG. 4 is shown in FIG. 7. Note that FIG. 7 shows only essential components of the data status register 52, in order to simplify the description.

As shown in FIG. 7, the data status register 52 comprises D flip-flops DFB31 to DFB0.

A power voltage VDD is connected to input terminals of DFB31 to DFB0 to set the input terminals "1" (logic level).

Similarly, the write pulse signal WP [31:0] from the write pulse generation circuit 54 is input to clock terminals of DFB31 to DFB0.

Outputs from exclusive-OR circuits OR3, OR2, OR1, and OR0 are input to reset terminals of DFB31 to DFB24, DFB23 to DFB16, DFB15 to DFB8, and DFB7 to DFB0. A signal PSTRB [3:0] is input to one input terminal of each of OR3 to OR0 and the RES signal is input to the other input terminal thereof.

Note that the PSTRB [3:0] signal is a pulse signal that goes active at given times at the rising edges of the strobe signal STRB [3:0] that is input from the determination circuit 60 of FIG. 4.

Output signals from DFB24, DFB16, DFB8, and DFB0, which correspond to the first bits of the data cells, are output to the determination circuit 60 of FIG. 4 as the VALID [3:0] signal that indicates whether each data cell is valid or invalid.

With the configuration of FIG. 7, each of DFB31 to DFB0 is set to "1" every time the corresponding pulse of the write pulse signal WP [31:0] goes active. If data is held in each bit (DFA31 to DFA0) of the data holding register 50 of FIG. 6, by way of example, the corresponding bits (DFB31 to DFB0) of the data status register 52 are also set to "1". In other words, the status of each bit of data in the data holding register 50 is held in the corresponding bit of the data status register 52 (as "1" for valid or "0" for invalid).

If each of PSTRB [3], PSTRB [2], PSTRB [1], and PSTRB [0] in FIG. 7 goes active, the corresponding components DFB31 to DFB24, DFB23 to DFB16, DFB15 to DFB8, and DFB7 to DFB0 are reset to "0". The data statuses held in DFB31 to DFB24, DFB23 to DFB16, DFB15 to DFB8, and DFB7 to DFB0 are the statuses of the data cells DFA31 to DFA24, DFA23 to DFA16, DFA15 to DFA8, and DFA7 to DFA0 of FIG. 6. The data statuses in the data status register 52 are therefore cleared in data cell units by making each part of PSTRB [3:0] go active in turn.

Note that the provision of DFB24, DFB16, DFB8, and DFB0 out of the D flip-flops DFB31 to DFB0 of FIG. 7 is sufficient for outputting the VALID [3:0] signal (it is sufficient to provided holding means for holding the statuses in data cell units), which means that the other D flip-flops DFB31 to DFB25, DFB23 to DFB17, DFB15 to DFB9, and DFB7 to DFB1 can be omitted.

It should be noted, however, that there will be mutually different load capacitances on the lines of WP [31:0] if these D flip-flops DFB31 to DFB25, DFB23 to DFB17, DFB15 to DFB9, and DFB7 to DFB1 are simply omitted. If WP [31] is connected to the clock terminal of DFA31 alone, whereas WP [24] is connected to the clock terminals of both DFA24 and DFB24, the load capacitance inherent to WP [24] will be greater than that of WP [31]. If there is a different load capacitance inherent to WP [31:0], there will be a signal delay difference on WP [31:0] which may cause a problem with unstable circuit operation.

To solve such a problem in this case, dummy components having the same load capacitance as the clock terminals of the D flip-flops DFB31 to DFB25, DFB23 to DFB17, DFB15 to DFB9, and DFB7 to DFB1 could be provided instead of those D flip-flops. It is desirable to use elements that have fewer transistors than D flip-flops (such as inverter circuits) as those dummy components.

Assume that the number of transistors in each D flip-flop is NDF, the number of transistors in each dummy component is NDM, and the number of omitted D flip-flops is NOM, by way of example. In such a case, the number of transistors can be reduced by NTR=(NDF−NDM)×NOM by using such dummy components, thus making the circuit structure more compact.

Figure 8:
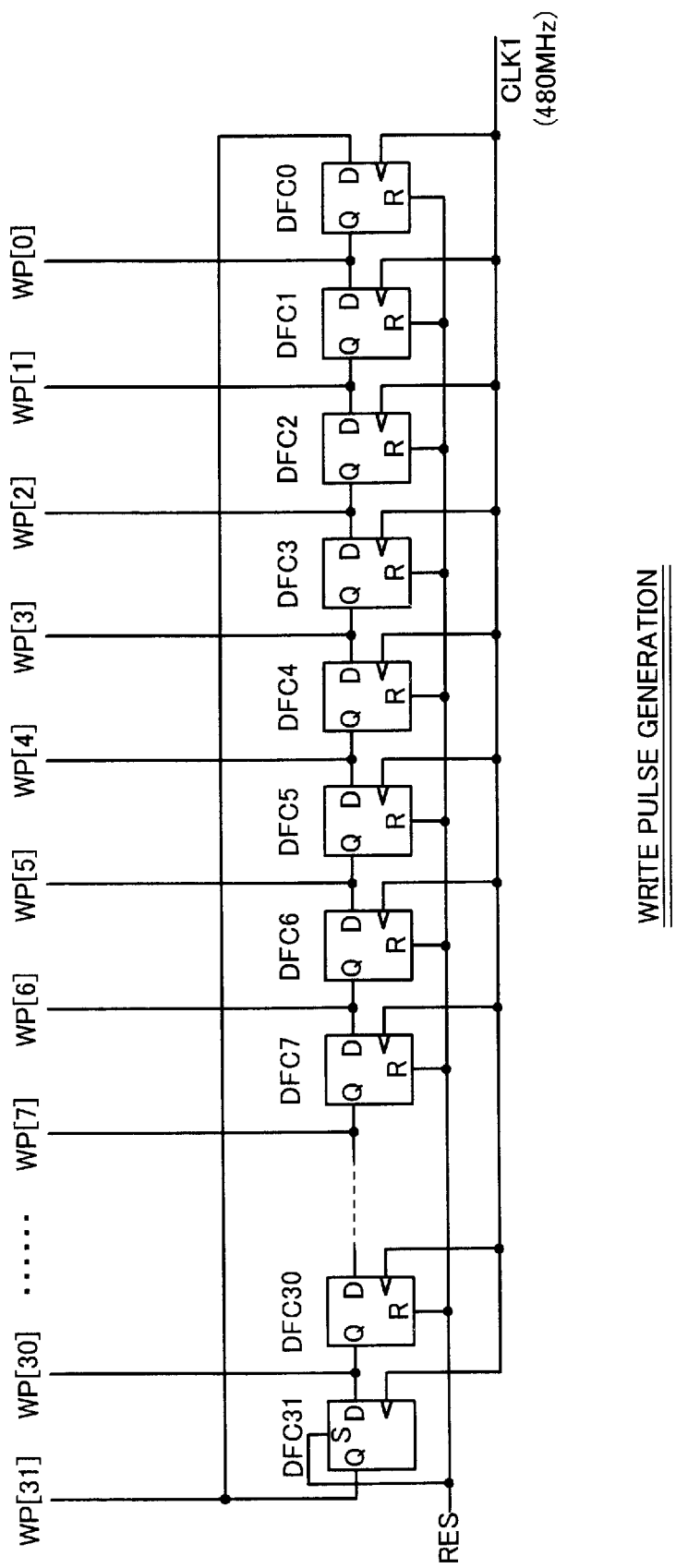
FIG. 8 shows a detailed example of the configuration of the write pulse generation circuit.

A detailed example of the configuration of the write pulse generation circuit 54 of FIG. 4 is shown in FIG. 8. Note that FIG. 8 shows only essential components of the write pulse generation circuit 54, in order to simplify the description.

As shown in FIG. 8, the write pulse generation circuit 54 comprises D flip-flops DFC31 to DFC0.

The output of each of the D flip-flops DFC31 to DFC0 is input to the data input terminal of the next-stage D flip-flop. In other words, the output of DFC31 is input to the data input terminal of DFC0, the output of DFC0 is input to the data input terminal of DFC1, and the output of DFC1 is input to the data input terminal of DFC2, by way of example.

The 480-MHz clock CLK1 from the HSDLL circuit 10 is input to clock terminals of DFC31 to DFC0.

Similarly, the RES signal is input to a set terminal of DFC31 and reset terminals of DFC30 to DFC0.

Output signals from DFC31 to DFC0 are output to the data holding register 50 and the data status register 52 as the write pulse signal WP [31:0].

If the RES signal goes active in the configuration shown in FIG. 8, DFC31 is set to "1" and DFC30 to DFC0 are reset to "0".

If CLK1 is input in this state, the "1" pulse is sequentially shifted in the direction from DFC0 to DFC31, and the write pulse signal WP [31:0] is generated for the data holding register 50 and the data status register 52.

1.4 Details of Operation

Figure 9:
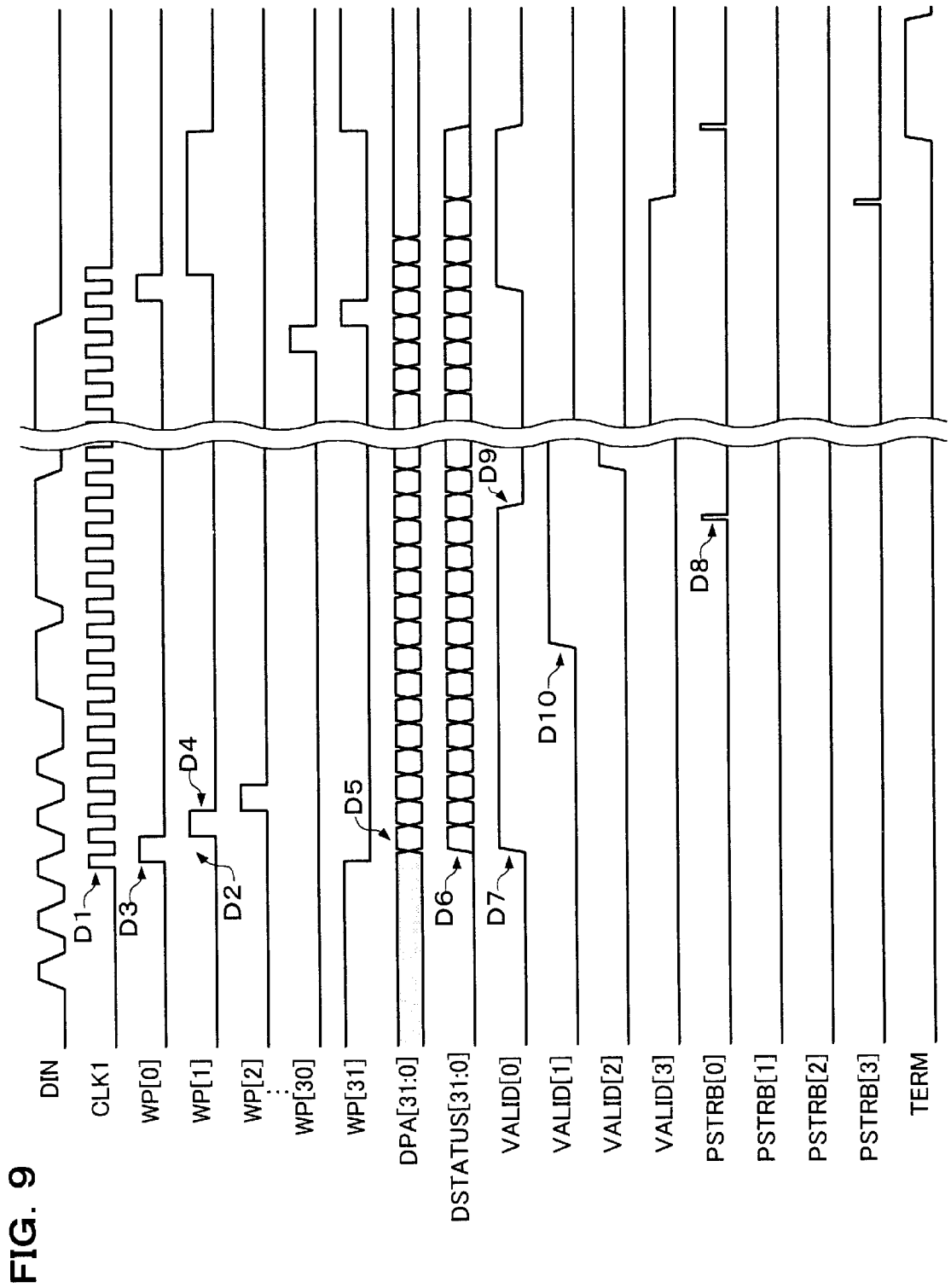
FIG. 9 is a timing waveform chart that illustrates the operation of this embodiment.
Figure 10:
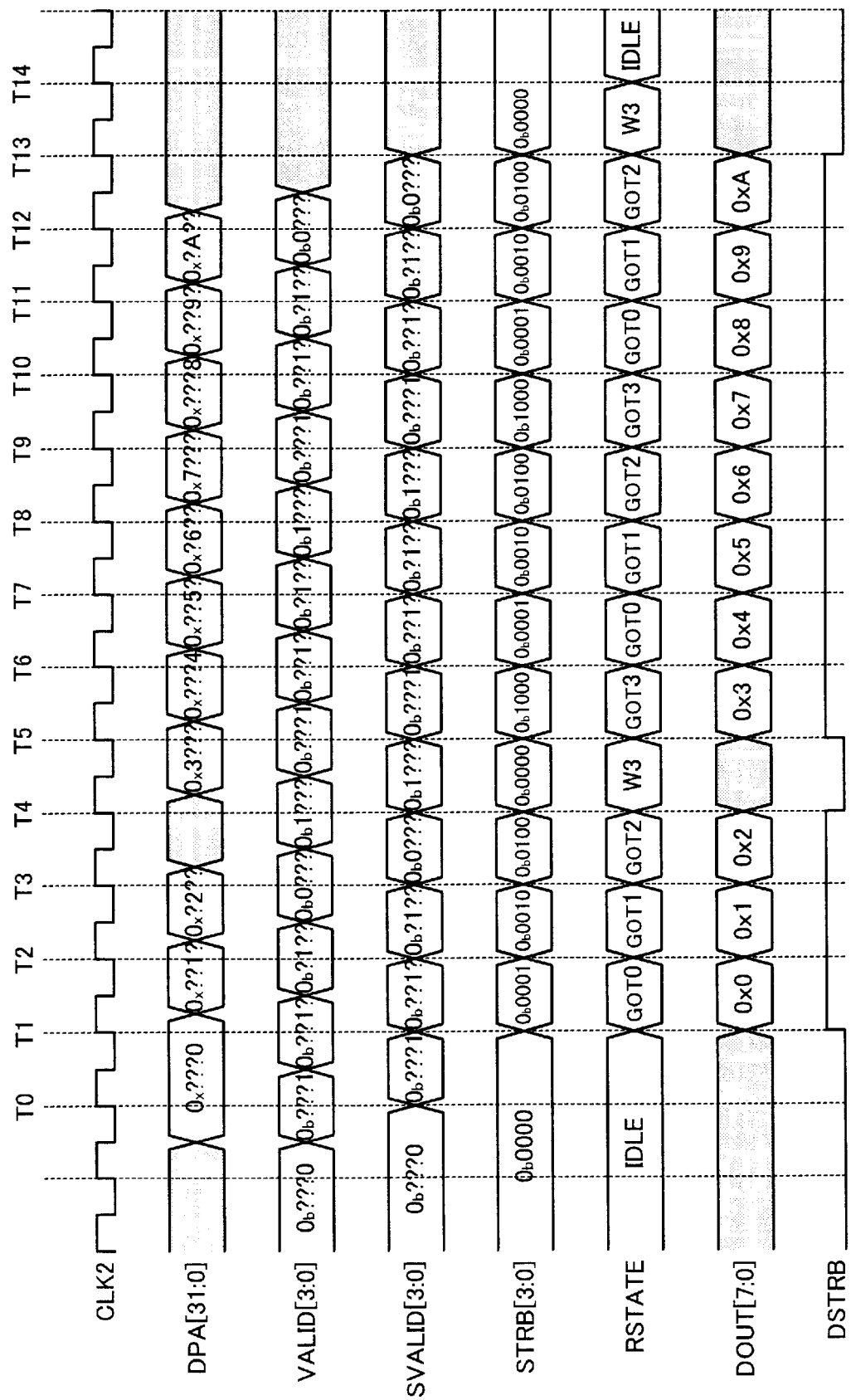
FIG. 10 is a timing waveform chart that further illustrates the operation of this embodiment.

The description now turns to details of the operation of this embodiment of the present invention, with reference to the timing waveform charts of FIGS. 9 and 10.

A short time after the serial data DIN has been input, the fetch clock CLK1 for DIN is input from the HSDLL circuit 10, as shown at D1 in FIG. 9.

When that happens, the write pulse generation circuit 54 generates the write pulse signal WP [31:0], based on this CLK1, as shown at D2 in FIG. 9. This WP [31:0] is a signal in which the pulses go active once every 32 clock cycles (N clock cycles) of CLK1, and also the periods at which the pulses go active shift sequentially by one clock cycle each, as shown at D3 and D4.

The data holding register 50 holds each bit of DIN, based on this WP [31:0] signal, and outputs DPA [31:0], as shown at D5 in FIG. 9. In a similar manner, the data status register 52 also holds the data status of each bit (DSTATUS [31:0]), based on this WP [31:0] signal.

The VALID [3:0] signal goes to "1" (logic level) when the first bit of each data cell is held, then to "0" (logic level) when the PSTRB [3:0] signal goes active. Note that PSTRB [3:0] is a pulse signal that goes active at the rising edge of STRB [3:0].

If data is held in DFA0 of the data holding register (see FIG. 6) for the first bit of a data cell, by way of example, DFB0 of the data status register 52 (see FIG. 7) is set to "1", so that VALID [0] changes to "1" as shown at D7 in FIG. 9.

When the PSTRB [0] pulse goes active at the rising edge of STRB [0] as shown at D8 in FIG. 9, DFB7 to DFB0 of the data status register (see FIG. 7) are reset, so that VALID [0] returns to "0" as shown at D9 in FIG. 9.

In addition, when data is held in DFA8 of the data holding register 50 for the first bit of the next data cell (see FIG. 6), VALID [1] goes to "1" as shown at D10 in FIG. 9, then returns to "0" when PSTRB [1] becomes active.

Similarly, VALID [2] and VALID [3] go to "1" when data is held in DFA16 and DFA24 of the data holding register 50 (see FIG. 6), then return to "0" when PSTRB [2] and PSTRB [3] go active.

The description now turns to a timing waveform chart of FIG. 10. Each question mark "?" in FIG. 10, such as in "$0_x$???0" or "$0_x$?A??", by way of example, denotes an invalid byte or a "don't care about valid or invalid" byte is valid/invalid, and each alphanumeric character such as "0" or "A" denotes a valid byte. Similarly, each question mark "?" in "$0_b$???0" or "$0_b$???1" denotes an invalid bit or a "don't care about valid or invalid" bit, and "0" and "1" denote valid bits. RSTATE indicates the state of the state machine 62 (see FIG. 4) and DSTRB is a signal that goes "1" when DOUT [7:0] is valid.

The determination circuit 60 determines whether or not the first bit of data (generally speaking: a given bit) in the data cell is valid, based on VALID [3:0] from the data status register 52, then controls the output of each data cell determined to be valid, at the next clock cycle of CLK2.

The first bit of the data cell for the number-0 byte (first byte) is determined to be valid, at T0 in FIG. 10, based on VALID [3:0] (or a SVALID [3:0] which is generated by synchronizing VALID [3:0] with CLK2). When that happens, the state RSTATE of the state machine 62 (see FIG. 4) goes from "IDLE" to "GOT0" at T1, which is the next clock cycle. The selector 66 selects the data of the data cell for that number-0 byte, based on the SEL [3:0] signal from the determination circuit 60, and outputs it as DOUT [7:0].

At this point, the determination circuit 60 changes STRB [0] from "0" to "1". This clears the data status of the data cell for the number-0 byte, which has been output.

The first bit of the data cell for the number-1 byte (second byte) is determined to be valid based on VALID [3:0] at T1 in FIG. 10. When that happens, the state RSTATE of the state machine 62 changes to "GOT1" at the next clock cycle T2. The data in the data cell for that number-1 byte is selected by the selector 66 and output as DOUT [7:0].

At this point, the determination circuit 60 changes STRB [1] from "0" to "1". This clears the data status of the data cell for the number-1 byte, which has been output.

The first bit of the data cell for the number-2 byte (third byte) is determined to be valid based on VALID [3:0] at T2 in FIG. 10. When that happens, the state RSTATE of the state machine 62 changes to "GOT2" at the next clock cycle T3. The data in the data cell for that number-2 byte is selected by the selector 66 and output as DOUT [7:0].

At this point, the determination circuit 60 changes STRB [2] from "0" to "1". This clears the data status of the data cell for the number-2 byte, which has been output.

The first bit of the data cell for the number-3 byte (fourth byte) is determined to be invalid based on VALID [3:0] at T3 in FIG. 10. When that happens, the state of the state machine 62 changes to "W3", indicating wait, at the next clock cycle T4. The output of DOUT [7:0] is made to wait for one clock cycle period.

Note that since the previous state is "GOT2" at T4 of FIG. 10, the state changes to "W3" indicating wait for the data cell for the number-3 byte. IF the data cell for the number-3 byte becomes valid at the next clock cycle T5, the state changes to "GOT 3". If the previous state is assumed to be "GOT1", by way of example, the state changes to "W2" indicating wait for the data cell for the number-2 byte and then the state changes to "GOT2" when the data cell for the number-2 byte becomes valid in the next clock cycle.

In this embodiment as described above, the serial data DIN is converted into 8-bit parallel data DOUT [7:0] and is output in synchronization with CLK2, while the data in the data cell units is determined to be valid or invalid. This makes it possible to implement a serial/parallel conversion circuit that has both a serial/parallel conversion function and a buffer function for absorbing differences such as those in clock frequency.

2. Characteristics of This Embodiment 2.1 Determination of Validity/Invalidity of Data Cell With this embodiment, the determination as to whether or not each data cell is valid is done by monitoring the data in the first bit (generally speaking: a given bit) of the data cell. Each data cell in which the first bit is determined to be valid is viewed as a valid data cell in the next clock cycle of CLK2 (generally speaking: the next clock cycle or subsequent clock cycles).

When the data in the first bit (DFA0 of FIG. 6) of the data cell DC0 of the data holding register 50 is held and the first bit (DFB0 of FIG. 7) of the data status corresponding to that DC0 is set to "1", the VALID [0] signal goes to "1" (D7 in FIG. 9), as shown in FIG. 11A.

When that happens, the determination circuit 60 that has received that VALID [0] signal (or SVALID [0] which is VALID[0] synchronized with CLK2) determines that DC0 is a valid data cell in the next clock cycle of CLK2, and outputs it as DOUT [7:0], as shown in FIGS. 11B and 11C.

In a similar manner, when the first bit of each of the data cells DC1, DC2, and DC3 becomes valid, the corresponding VALID [1], [2], or [3] goes to "1" and the determination circuit 60 that receives that signal determines that DC1, DC2, or DC3 is valid at the next clock cycle of CLK2.

With this embodiment as configured above, the validity or invalidity of each data cell is determined by monitoring only the validity or validity of the first bit (generally speaking: a given bit) thereof, instead of all the bits of the data cell, which means that the bit width of the VALID signal can be reduced and thus the configuration and processing of the determination circuit 60 can be simplified. The number of bits (depth) of the data holding register 50 could be even smaller.

The validity/invalidity of each data cell can be determined based on clock cycles of CLK2, which has a low frequency of 60 MHz, instead of at clock cycles of CLK1, which has a high frequency of 480 MHz. It is therefore possible to design a certain amount of leeway into the timing of the determination processing, thus making it possible to implement the functions of an elasticity buffer that absorbs any difference in clock frequency with respect to an external device, without using the latest semiconductor processes.

This embodiment is also provided with the data status register 52 separately from the data holding register 50, and determines the validity or invalidity of each data cell from the VALID [3:0] signal from the data status register 52. It is therefore possible to ensure that the configuration of the data holding register 50 is the simple one shown in FIG. 6, thus implementing reliable fetching of the serial data DIN.

Note that although it is particularly preferable to determine whether or not a data cell is valid from the first bit, the determination could also be done by a bit other than the first bit.

In this embodiment, a data cell having a first bit that is determined to be valid in the K-th clock cycle of CLK2 is viewed as valid in the subsequent (K+1)-th clock cycle, but the data cell could be viewed as valid in the (K+2)-th clock cycle onward, by way of example. If the serial data DIN is converted into 16-bit parallel data in synchronization with 60 MHz, instead of 8-bit data, the bit width of each data cell would be 16 bits. Similarly, a data cell having a first bit that is determined to be valid in the K-th clock cycle could be viewed as valid in the (K+2)-th clock cycle instead of the (K+1)-th one. Alternatively, the determination as to whether or not a 16-bit wide data cell is valid could be determined by viewing the ninth bit thereof.

Note that the data statuses held in the data status register 52 in accordance with this embodiment are cleared in data cell units.

For instance, when the data cell DC0 has been output (when the processing of DC0 has ended), the data status corresponding to that data cell DC0 is cleared, as shown in FIG. 12A. Similarly, when the data cell DC1 has been output, the data status corresponding to that data cell DC1 is cleared, as shown in FIG. 12B. Furthermore, when DC2 and DC3 are output in turn, the data statuses corresponding to DC2 and DC3 are cleared.

This configuration makes it possible to hold data statuses as appropriate in the data status register 52, even when the data holding register 50 is formed as a ring buffer.

2.2 Wait Control

This embodiment is configured in such a manner that the determination of whether or not a data cell is valid is done in each clock cycle of CLK2, and the output of data of a data cell that been determined not to be valid is made to wait for at least one clock cycle.

Figure 13:
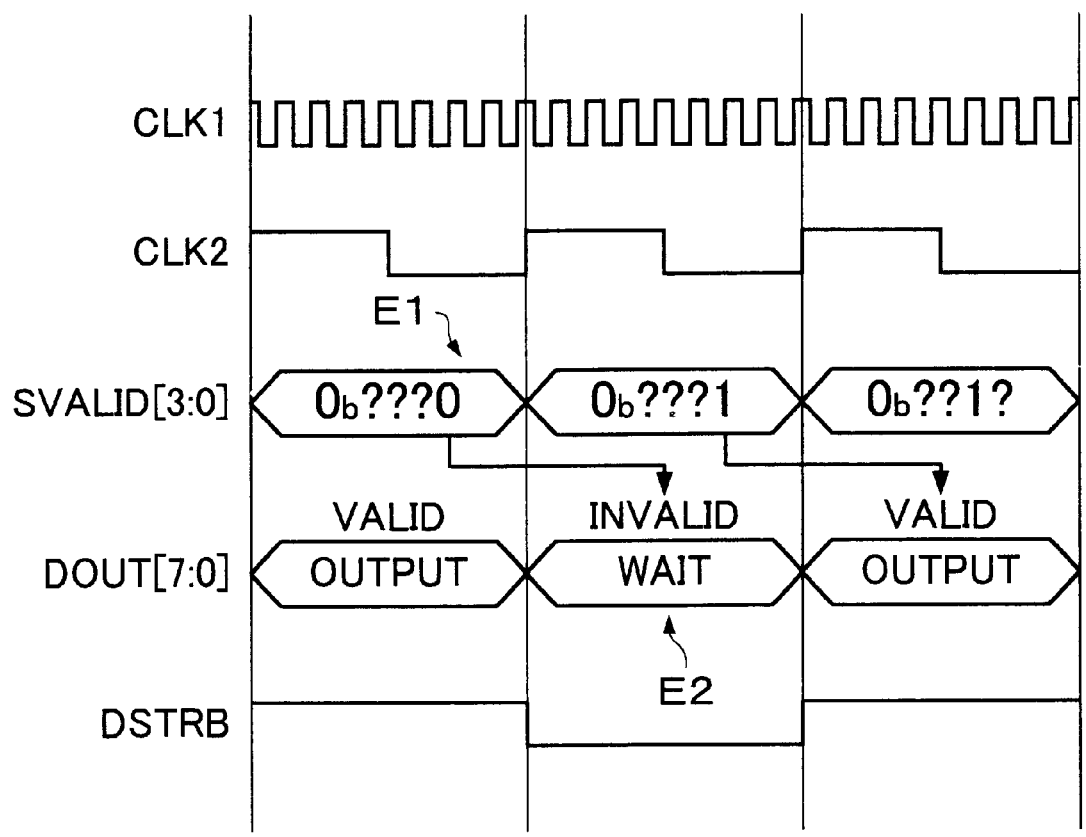
FIG. 13 is illustrative of wait control in accordance with this embodiment.

For example, the data cell for the number-0 byte is determined to be invalid at E1 in FIG. 13, so the output of DOUT [7:0] corresponding to that data cell is made to wait for a certain time, such as one clock cycle (or two or more clock cycles), as shown at E2.

The execution of such wait control ensures that only suitable data is output to the later-stage circuit as DOUT [7:0]. In other words, the later-stage circuit could fetch DOUT [7:0] when the DSTRB signal is "1", and delay the fetching of data when DSTRB is "0". This wait control makes it possible to prevent the occurrence of processing failures even when the elasticity buffer 12 (data holding register) goes into an underflow state.

In the comparative example of FIG. 2, all of the circuits have to operate at the high frequency of 480 MHz, making it extremely difficult to impose the wait control illustrated in FIG. 13. There is also the possibility of processing failure with the comparative example of FIG. 2, if the elasticity buffer 600 goes into an underflow state, because the input serial data DIN has to be output sequentially at the 480-MHz CLK3.

In contrast thereto, this embodiment makes it possible for the determination circuit 60 that imposes the wait control to operate at the low frequency of 60 MHz. It therefore differs from the comparative example of FIG. 2 in that the processing can be given a certain amount of timing leeway, making it possible to implement intelligent wait control by using the state machine 62. If the elasticity buffer 12 goes into an underflow state, therefore, this embodiment makes it possible to wait until the underflow state is resolved, enabling efficient prevention of processing failures.

2.3 Utilization of Write Pulse Signal

Figure 14:
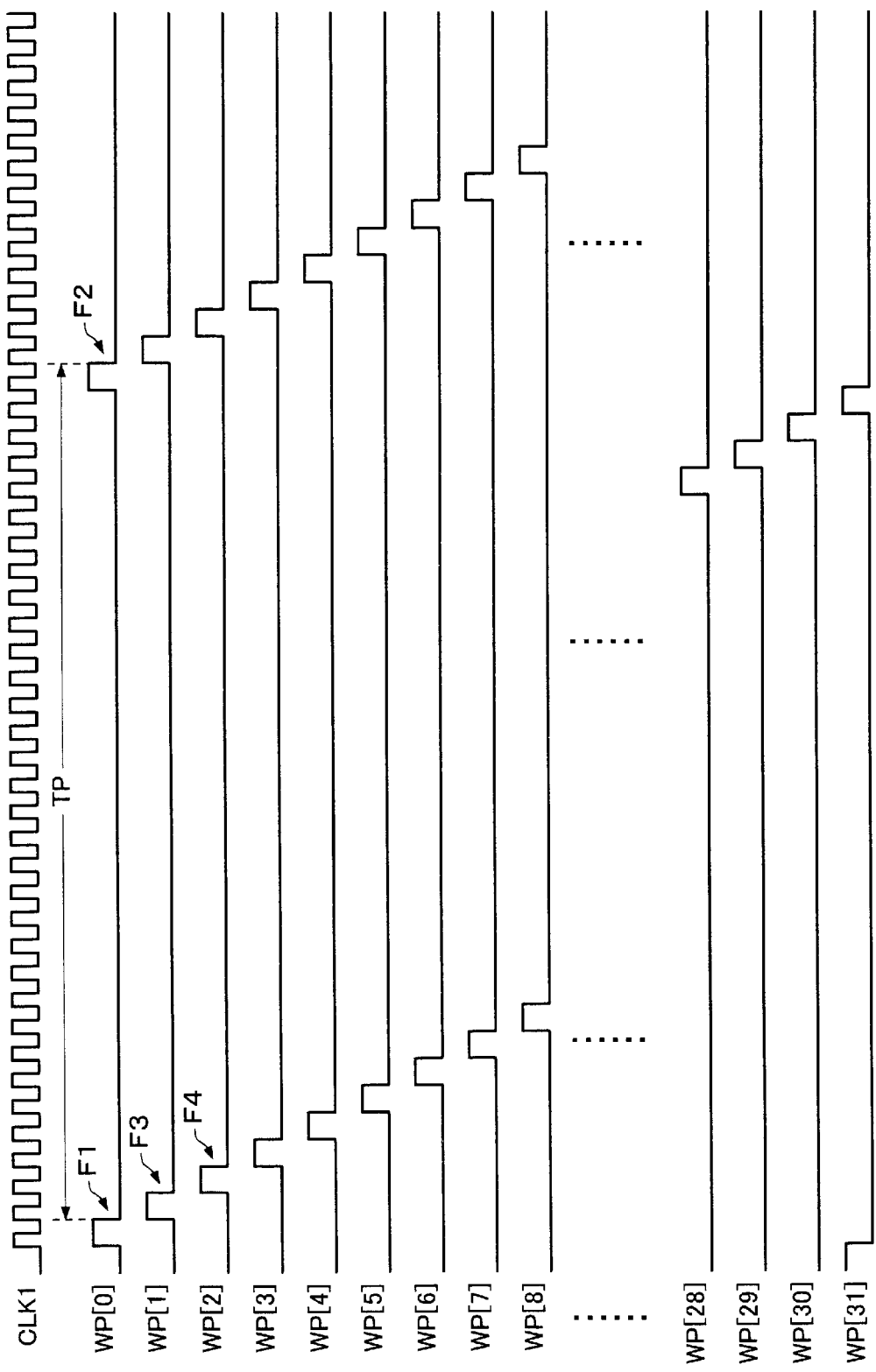
FIG. 14 is a timing waveform chart that illustrates the write pulse signal.

With this embodiment, the write pulse signal WP [31:0] shown in FIG. 14 is used in holding each bit of data in the data holding register 50 and each bit of data status in the data status register 52.

In this case, the write pulse signal WP [31:0] is a signal having pulses that go active periodically, such as once every 32 clock cycles (generally speaking: N clock cycles), as shown at F1 and F2 in FIG. 14. The periods at which the pulses go active are shifted sequentially by one clock cycle, as shown at F1, F3, and F4 in FIG. 14.

Thus, if the generation of the write pulse signal WP [31:0] is based on the high-frequency CLK1 and the operation of the data holding register 50 and the data status register 52 is based on this WP [31:0], it is possible to provide a certain amount of leeway in the operation of the data holding register 50 and the data status register 52. In other words, the period TP during which the write pulse signal WP [31:0] is active can be extended, as shown in FIG. 14, making it possible to provide a certain amount of leeway in the set-up and hold times of the D flip-flops of the data holding register 50 and data status register 52. Since this period TP is extended in this manner, that period TP can be utilized for processing such as overflow control.

In addition, if the data holding register 50 of FIG. 6 is made to operate by using the write pulse signal WP [31:0] that goes active periodically, it becomes possible to implement a ring buffer of a simple configuration.

2.4 Clock Frequency Setting

Figure 15:
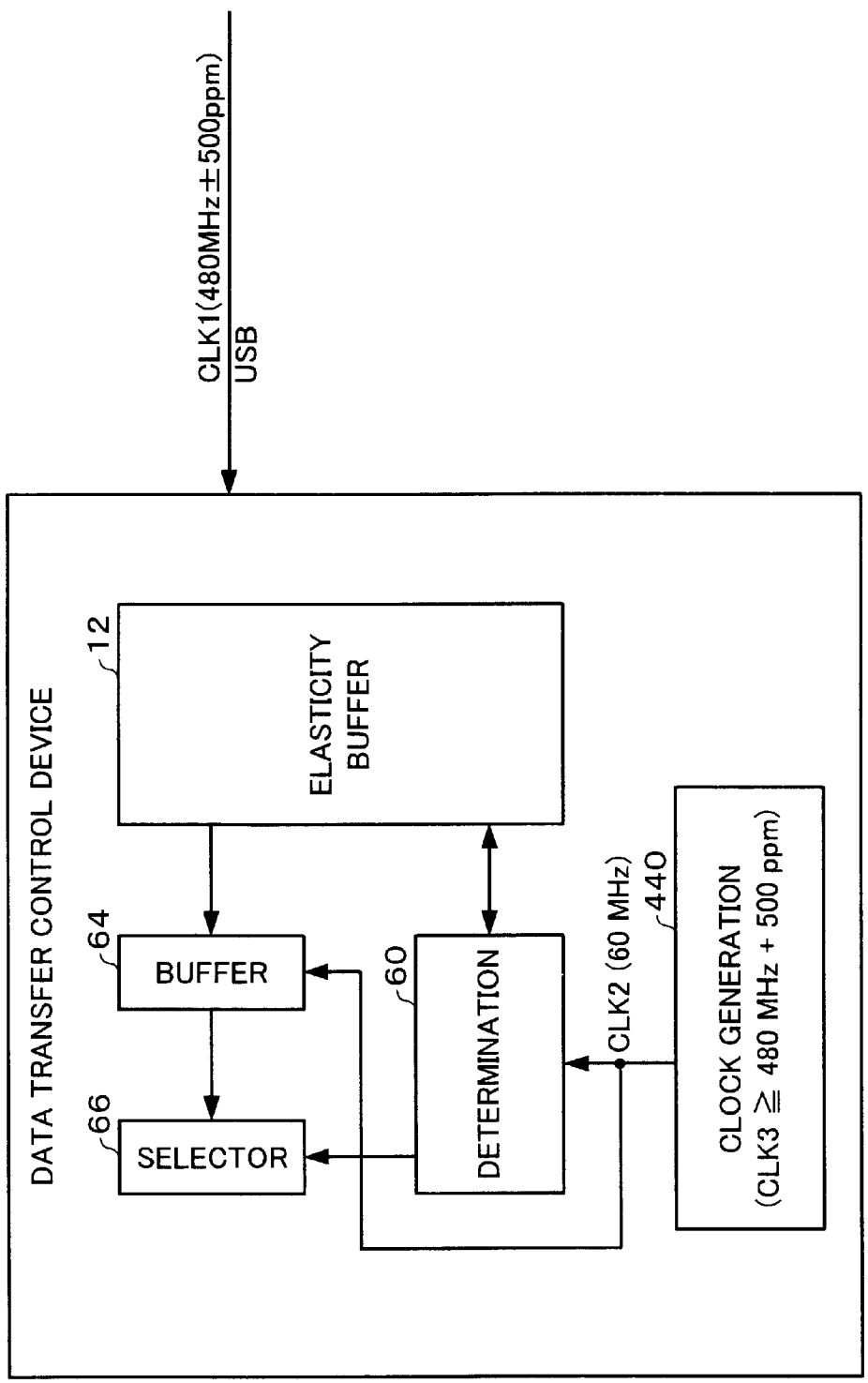
FIG. 15 is illustrative of a method of setting clock frequency.

The maximum clock error in HS mode under the USB 2.0 standard (generally speaking: a given standard) is 480 MHz±500 ppm, as shown in FIG. 15. If both the external device and internal device observe this 480 MHz±500 ppm standard, it is possible to prevent the generation of overflow and underflow errors by setting the depth of the elasticity buffer 12 suitably (such as to a 32-bit depth in accordance with this embodiment).

However, there is a danger that overflow and underflow errors may occur even if the elasticity buffer 12 has been set to a suitable depth, if the external device connected to the bus does not observe the maximum clock error standard or if some other malfunction occurs.

To deal with the problem in such a case, the 60-MHz CLK2 (second clock) that governs the operation of the subsequent-stage circuit of the elasticity buffer 12 could be generated based CLK3 (a third clock) of a frequency higher than that of CLK1 of which frequency is defined by the USB 2.0 HS mode. If the standard for the frequency of CLK1 is 480 MHz±500 ppm, for example, the maximum value of the frequency of CLK3 is at least 480 MHz+500 ppm. The 60-MHz CLK2 clock is generated by dividing this CLK3.

Since this configuration makes it possible to set the clock frequency of the internal device (≧480 MHz+500 ppm) to be at least as high as the clock frequency of the external device (480 MHz±500 ppm), underflow errors can readily occur but the possibility of overflow errors is substantially removed.

With this embodiment, underflow errors can be handled appropriately by the wait control described with reference to FIG. 13. If the clock frequencies are set as shown in FIG. 15, therefore, it becomes possible to implement a data transfer control device that can cope flexibly even when the external device does not observe a clock frequency standard.

3. Electronic Equipment

The description now turns to examples of electronic equipment comprising the data transfer control device of this embodiment.

Figure 16A:
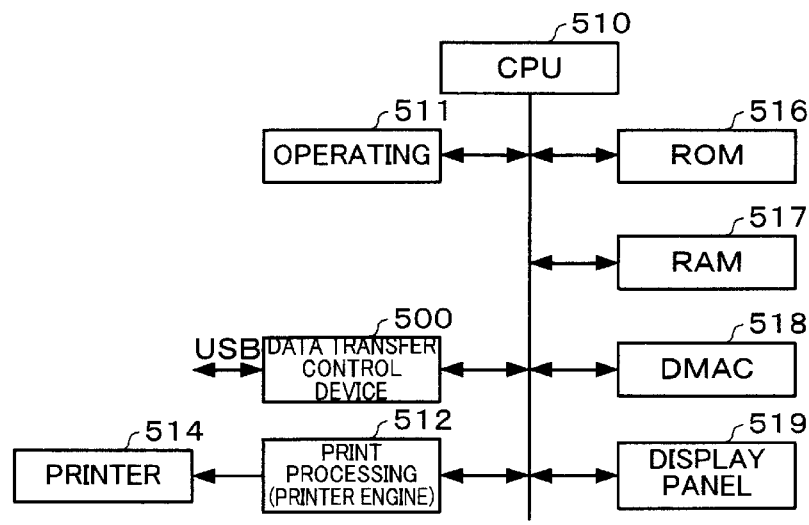
FIGS. 16A, 16B, and 16C are internal block diagrams of various items of electronic equipment.
Figure 17A:
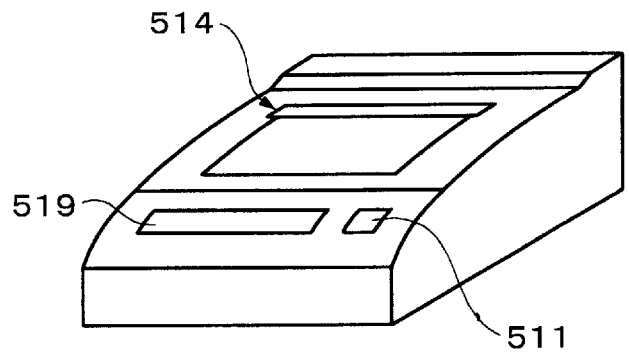
FIGS. 17A, 17B, and 17C show typical external views of various items of electronic equipment.

An internal block diagram of a printer that is one example of such electronic equipment is shown in FIG. 16A with an external view thereof being shown in FIG. 17A. A CPU (microcomputer) 510 has various functions, including that of controlling the entire system. An operating section 511 is designed to enable the user to operate the printer. Data such as a control program and fonts is stored in a ROM 516, and a RAM 517 functions as a work area for the CPU 510. A DMAC 518 is a DMA controller for transferring data through the CPU 510. A display panel 519 is designed to inform the user of the operational state of the printer.

Serial print data that has been send in from another device such as a personal computer via USB is converted into parallel print data by a data transfer control device 500. The thus converted parallel print data is sent to a print processing section (a printer engine) 512 by the CPU 510 or the DMAC 518. This parallel print data is subjected to given processing in the print processing section 512 and is output for printing to paper by a print section (a device for outputting data) 514 comprising components such as a print head.

Figure 16B:
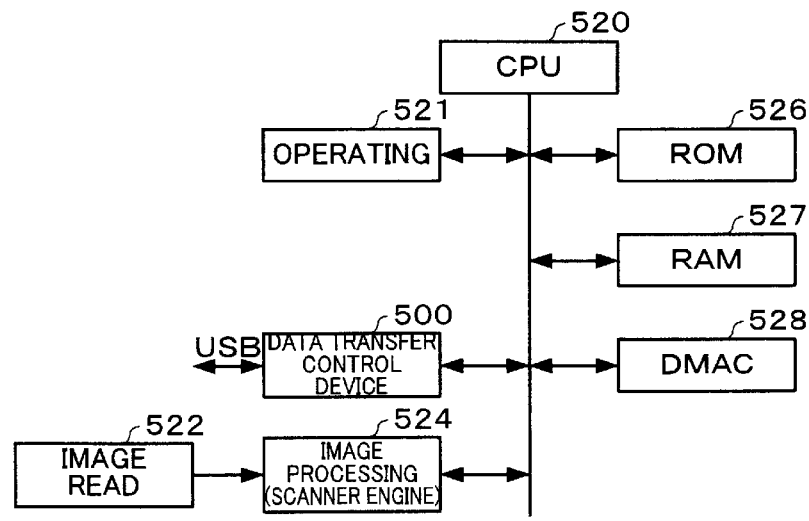
Figure 17B:
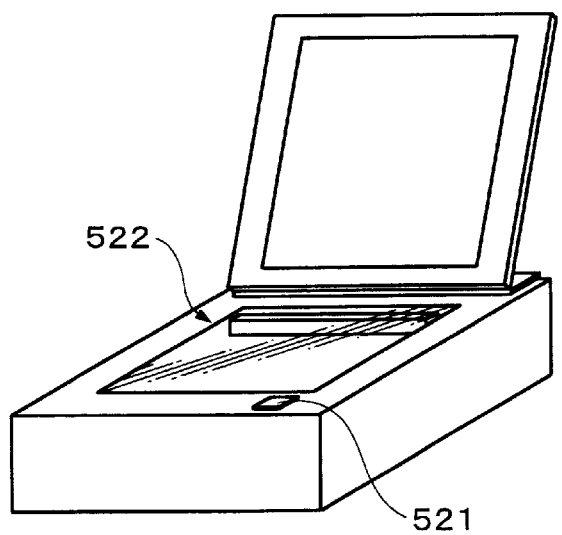

An internal block diagram of a scanner that is another example of electronic equipment is shown in FIG. 16B with an external view thereof being shown in FIG. 17B. A CPU 520 has various functions, including that of controlling the entire system. An operating section 521 is designed to enable the user to operate the scanner. Data such as a control program is stored in a ROM 526, and a RAM 527 functions as a work area for the CPU 520. A DMAC 528 is a DMA controller.

An image of a document is read in by an image read section (a device for fetching data) 522, which comprises components such as a light source and an opto-electric converter, and data of the read-in image is processed by an image processing section (a scanner engine) 524. The processed image data is sent to the data transfer control device 500 by the CPU 520 or DMAC 528. The data transfer control device 500 converts that parallel image data into serial data and sends it to another device such as a personal computer via USB.

Figure 16C:
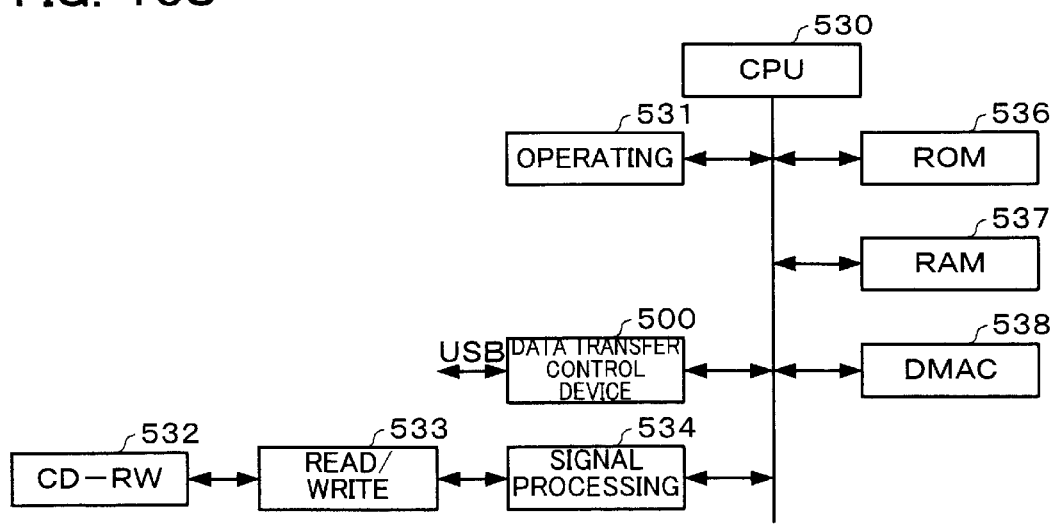
Figure 17C:
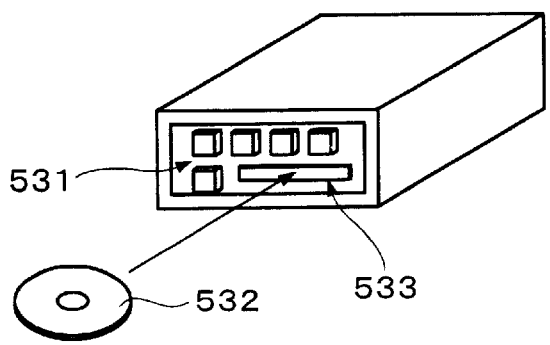

An internal block diagram of a CD-RW drive that is a further example of electronic equipment is shown in FIG. 16C with an external view thereof being shown in FIG. 17C. A CPU 530 has various functions, including that of controlling the entire system. An operating section 531 is designed to enable the user to operate the CD-RW drive. Data such as a control program is stored in a ROM 536, and a RAM 537 functions as a work area for the CPU 530. A DMAC 538 is a DMA controller.

Data read out from a CD-RW 532 by a read/write section (a device for fetching data or a device for storing data) 533, which comprises components such as a laser, a motor, and an optical system, is input to a signal processing section 534 where it is subjected to given signal processing such as error correction. The data that has been subjected to this signal processing is sent to the data transfer control device 500 by the CPU 530 or the DMAC 538. The data transfer control device 500 converts this parallel data into serial data, then sends it to another device such as a personal computer via USB.

Serial data that comes in from another device via USB, on the other hand, is converted into parallel data by the data transfer control device 500. This parallel data is sent to the signal processing section 534 by the CPU 530 or the DMAC 538. This parallel data is subjected to given signal processing by the signal processing section 534 then is stored by the read/write section 533 on the CD-RW 532.

Note that a separate CPU for controlling data transfer by the data transfer control device 500 could be provided in addition to the CPU 510, 520, or 530 of FIGS. 16A, 16B, and 16C.

Use of the data transfer control device of this embodiment in electronic equipment makes it possible to transfer data in the HS mode laid down by USB 2.0. When a user uses a personal computer or the like to specify a printout, it is therefore possible to complete printing with only a small time lag. Similarly, the user can view an image that is read in with only a small time lag after a scanner has been instructed to fetch the image. It also makes it possible to read data from a CD-RW and write data to a CD-RW at high speed.

Use of the data transfer control device of these embodiments in electronic equipment also makes it possible to fabricate an IC for the data transfer control device by ordinary semiconductor processes, which have low fabrication costs. It is therefore possible to reduce the price of the data transfer control device and thus reduce the price of the electronic equipment. Since the number of components that operate at high speed during data transfer control can be reduced, it is possible to increase the reliability of data transfer, thus increasing the reliability of the electronic equipment.

Note that the electronic equipment that can employ a data transfer control device in accordance with the present invention is not limited to the above described embodiments, and thus various other examples can be considered, such as various types of optical disk drive (CD-ROM or DVD), magneto-optical (MO) disk drives, hard disk drives, TVs, VCRs, video cameras, audio equipment, telephones, projectors, personal computers, electronic organizers, and dedicated wordprocessors.

Note also that the present invention is not limited to the embodiments described herein, and various modifications are possible within the scope of the invention laid out herein.

For example, the configuration of the data transfer control device in accordance with the present invention is not limited to that shown in FIG. 1.

It is particularly preferable that the configuration of the serial/parallel conversion circuit is as shown in FIG. 4, but it is not limited thereto and thus various modifications are possible.

Similarly, the configurations of the data holding means (data holding register), the data status holding means (data status register), and the write pulse generation means (write pulse generation circuit) are not limited to those shown in FIGS. 6, 7, and 8.

Details such as the number of bits in each data cell; the frequencies of the first, second, and third clocks; and the numbers of bits of the data holding register, the data status holding means, and the write pulse generation means are given herein by way of example, and thus are not limited.

It is particularly desirable to apply the present invention to data transfer under USB 2.0, but it is not limited thereto. For example, the present invention can also be applied to data transfer in accordance with a standard that is based on a concept similar to that of USB 2.0, or a standard that is developed from USB 2.0.

What is claimed is:

1. A serial/parallel conversion circuit which converts serial data into parallel data, the serial/parallel conversion circuit comprising:
    a data holding circuit which receives and holds serial data that is input based on a first clock;
    a determination circuit which determines whether or not a data cell is valid, the data cell configured of a plurality of bits of data held in the data holding circuit; and
    a circuit which outputs data of a data cell that has been determined to be valid, based on a second clock having a frequency lower than a frequency of the first clock,
    wherein the determination circuit operates based on the second clock.

2. The serial/parallel conversion circuit as defined by claim 1, wherein the determination circuit determines that a data cell in which a given bit of data has been determined to be valid in a K-th clock cycle of the second clock is a valid data cell in (K+1)-th or subsequent clock cycles of the second clock.

3. The serial/parallel conversion circuit as defined by claim 1,
wherein the determination circuit determines whether or not a data cell is valid for each clock cycle of the second clock, and causes an output of a data cell to wait for at least one clock cycle when the data cell is determined to be invalid.

4. The serial/parallel conversion circuit as defined by claim 1, further comprising:
a data status holding circuit which holds a status of data held in the data holding circuit,
wherein the determination circuit determines whether or not each data cell is valid, based on a data status from the data status holding circuit.

5. The serial/parallel conversion circuit as defined by claim 1, further comprising:
a data status holding circuit which holds a status of data held in the data holding circuit,
wherein the determination circuit determines whether or not to wait to output data of a data cell, based on a data status from the data status holding circuit.

6. The serial/parallel conversion circuit as defined by claim 1, further comprising:
a data status holding circuit which holds a status of data held in the data holding circuit,
wherein the determination circuit clears the data status held in the data status holding circuit by unit of a data cell.

7. The serial/parallel conversion circuit as defined by claim 1, further comprising:
a data status holding circuit which holds a status of data held in the data holding circuit; and
a write pulse generation circuit which generates first to N-th write pulse signals having pulses that go active periodically once every N clock cycles of the first clock, and a period at which a pulse of each of the first to N-th write pulse signals going active is shifted from one another by one clock cycle of the first clock,
wherein the data holding circuit holds data, based on the first to N-th write pulse signals, and
wherein the data status holding circuit holds the data status, based on the first to N-th write pulse signals.

8. A serial/parallel conversion circuit which converts serial data into parallel data, the serial/parallel conversion circuit comprising:
a data holding circuit which receives and holds serial data that is input based on a first clock;
a circuit which outputs data from the data holding circuit based on a second clock having a frequency lower than a frequency of the first clock;
a data status holding circuit which holds a status of data held in the data holding circuit; and
a write pulse generation circuit which generates first to N-th write pulse signals having pulses that go active periodically once every N clock cycles of the first clock, and a period at which a pulse of each of the first to N-th write pulse signals going active is shifted from one another by one clock cycle of the first clock,
wherein the data holding circuit holds data, based on the first to N-th write pulse signals, and
wherein the data status holding circuit holds the data status, based on the first to N-th write pulse signals.

9. A data transfer control device which transfers data over a bus, the data transfer control device comprising:
the serial/parallel conversion circuit as defined by claim 1; and
a circuit which receives data from the serial/parallel conversion circuit and performs given processing for data transfer.

10. A data transfer control device which transfers data over a bus; the data transfer control device comprising:
the serial/parallel conversion circuit as defined by claim 8; and
a circuit which receives data from the serial/parallel conversion circuit and performs given processing for data transfer.

11. The data transfer control device as defined by claim 9,
wherein when data transfer is performed in accordance with a given standard, the second clock is generated based on a third clock having a frequency higher than a frequency of the first clock defined by the given standard.

12. The data transfer control device as defined by claim 10,
wherein when data transfer is performed in accordance with a given standard, the second clock is generated based on a third clock having a frequency higher than a frequency of the first clock defined by the given standard.

13. The data transfer control device as defined by claim 9,
wherein data transfer is in accordance with an universal serial bus (USB) standard.

14. The data transfer control device as defined by claim 10,
wherein data transfer is in accordance with an universal serial bus (USB) standard.

15. Electronic equipment comprising:
the data transfer control device as defined by claim 9; and
a device which performs output processing, fetch processing or storage processing on data transferred through the data transfer control device and the bus.

16. Electronic equipment comprising:
the data transfer control device as defined by claim 10; and
a device which performs output processing, fetch processing or storage processing on data transferred through the data transfer control device and the bus.

17. Electronic equipment comprising:
the data transfer control device as defined by claim 11; and
a device which performs output processing, fetch processing or storage processing on data transferred through the data transfer control device and the bus.

18. Electronic equipment comprising:
the data transfer control device as defined by claim 12; and a device which performs output processing, fetch processing or storage processing on data transferred through the data transfer control device and the bus.

19. Electronic equipment comprising:

the data transfer control device as defined by claim 13; and a device which performs output processing, fetch processing or storage processing on data transferred through the data transfer control device and the bus.

20. Electronic equipment comprising:

the data transfer control device as defined by claim 14; and a device which performs output processing, fetch processing or storage processing on data transferred through the data transfer control device and the bus.

* * * * *